(12) United States Patent
Hale et al.

(10) Patent No.: US 12,213,267 B2
(45) Date of Patent: Jan. 28, 2025

(54) ELECTRONIC DEVICES HAVING FOLDING EXPANDABLE DISPLAYS

(71) Applicant: Apple Inc., Cupertino, CA (US)

(72) Inventors: Owen D. Hale, Oakland, CA (US); Tatsuya Sano, San Jose, CA (US); Chang-Chia Huang, Cupertino, CA (US); Yasmin F. Afsar, Princeton, NJ (US); Hoon Sik Kim, San Jose, CA (US); Michael B. Wittenberg, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 249 days.

(21) Appl. No.: 16/784,833

(22) Filed: Feb. 7, 2020

(65) Prior Publication Data

US 2020/0383219 A1 Dec. 3, 2020

Related U.S. Application Data

(60) Provisional application No. 62/853,642, filed on May 28, 2019.

(51) Int. Cl.
*H05K 5/02* (2006.01)
*E05D 3/06* (2006.01)
(Continued)

(52) U.S. Cl.
CPC ............ *H05K 5/0226* (2013.01); *E05D 3/06* (2013.01); *E05D 3/122* (2013.01); *E05D 3/18* (2013.01);
(Continued)

(58) Field of Classification Search
None
See application file for complete search history.

(56) References Cited

U.S. PATENT DOCUMENTS

| 9,047,055 B2 | 6/2015 | Song |
| 9,173,287 B1 | 10/2015 | Kim et al. |

(Continued)

FOREIGN PATENT DOCUMENTS

| CN | 102549645 A | 7/2012 |
| CN | 105074618 A | 11/2015 |

(Continued)

*Primary Examiner* — James Wu
*Assistant Examiner* — Christopher L Augustin
(74) *Attorney, Agent, or Firm* — Treyz Law Group, P.C.; G. Victor Treyz; David K. Cole

(57) ABSTRACT

An electronic device has a foldable display. First and second portions of an electronic device housing for the device may be joined using hinge structures. A flexible display may overlap the first housing portion, the hinge structures, and the second housing portion. A layer such as a layer of sheet metal may be used in supporting the display and may overlap the hinge structures. The hinge structures may include gear teeth, belts, and/or other movement synchronization structures. The hinge structures may include members that move relative to each other during bending. The moving members may include bars and links with opposing curved bearing surfaces. Stop surfaces may prevent excessive rotation of the bars and links with respect to each other. The links may rotate about pivot points that lie within the thickness of the display without the hinge structure living within the thickness of the display.

18 Claims, 21 Drawing Sheets

(51) Int. Cl.
*E05D 3/12* (2006.01)
*E05D 3/18* (2006.01)
*H05K 5/00* (2006.01)

(52) U.S. Cl.
CPC ........ *H05K 5/0017* (2013.01); *E05Y 2999/00* (2024.05)

(56) References Cited

U.S. PATENT DOCUMENTS

| | | | |
|---|---|---|---|
| 9,459,656 B2 | 10/2016 | Shai | |
| 9,603,271 B2 * | 3/2017 | Lee | H05K 5/0226 |
| 9,910,458 B2 | 3/2018 | Watanabe et al. | |
| 10,070,546 B1 * | 9/2018 | Hsu | H04M 1/0268 |
| 10,174,534 B2 | 1/2019 | Tazbaz et al. | |
| 10,420,233 B2 * | 9/2019 | Lee | H05K 5/0017 |
| 10,481,641 B2 * | 11/2019 | Lee | G06F 1/1652 |
| 10,834,814 B2 * | 11/2020 | Cho | H04M 1/0247 |
| 10,838,467 B1 * | 11/2020 | Mehandjiysky | E05D 3/06 |
| 10,855,824 B2 * | 12/2020 | Park | E05D 3/06 |
| 10,968,673 B2 * | 4/2021 | Aagaard | H04M 1/0216 |
| 11,453,193 B2 * | 9/2022 | Cosgrove | G09F 9/301 |
| 2017/0092884 A1 | 3/2017 | Zhang et al. | |
| 2018/0011515 A1 * | 1/2018 | Yoo | G06F 1/1616 |
| 2018/0135674 A1 * | 5/2018 | Cosgrove | H10K 77/111 |
| 2018/0217639 A1 | 8/2018 | Jones et al. | |
| 2018/0242466 A1 | 8/2018 | Lee et al. | |
| 2018/0324964 A1 * | 11/2018 | Yoo | G06F 1/1681 |
| 2019/0033920 A1 * | 1/2019 | Yun | G06F 1/1652 |
| 2019/0050023 A1 * | 2/2019 | Wu | A44C 5/02 |

FOREIGN PATENT DOCUMENTS

| | | | | |
|---|---|---|---|---|
| CN | 105630225 A | 6/2016 | | |
| CN | 106527585 A | 3/2017 | | |
| CN | 107690304 A | 2/2018 | | |
| CN | 108076171 A | 5/2018 | | |
| CN | 108538208 A | 9/2018 | | |
| KR | 20150060278 A | 6/2015 | | |
| WO | WO-2019174350 A1 * | 9/2019 | | G06F 1/1681 |

* cited by examiner

ELECTRONIC DEVICES HAVING FOLDING EXPANDABLE DISPLAYS

This application claims the benefit of provisional patent application No. 62/853,642, filed May 28, 2019, which is hereby incorporated by reference herein in its entirety.

FIELD

This relates generally to electronic devices, and, more particularly, to electronic devices with displays.

BACKGROUND

Electronic devices often include displays. A touch screen display may be used in a cellular telephone or other portable device to display information for a user and to gather user input.

If care is not taken, a display may not offer sufficient screen real estate to display information of interest to a user. At the same time, it can be difficult to enlarge the size of electronic devices too much to accommodate larger displays, because this can make devices too bulky.

SUMMARY

An electronic device may have a foldable display supported by a foldable electronic device housing. First and second portions of the electronic device housing may be joined using hinge structures. The electronic device may have a flexible display such as an organic light-emitting diode display. The flexible display may overlap the first housing portion, the hinge structures, and the second housing portion. A flexible supporting layer such as a layer of sheet metal may be used in supporting the display and may overlap the hinge structures.

The hinge structures may include members that are configured to move relative to each other as the hinge structures are bent. In some configurations, hinge structures for the device include gear teeth, belts, and/or other movement synchronization structures. The moving members in the hinge structures may include bars and links with opposing curved bearing surfaces. Stop surfaces may prevent excessive rotation of the bars and links with respect to each other.

The bars and links or other moving members in the hinge structures may rotate relative to each other about virtual pivot points that lie outside of the hinge structures. The pivot points may establish a reduced stress plane (e.g., a neutral stress plane or approximation of a neutral stress plane). The reduced stress plane may lie within the flexible display. This may help reduce stress on the pixels or other brittle layers of the display module as the display is bent.

In some configurations, the hinge structures may include a sliding hinge pin support plate. A hinge pin that passes through the second portion of the housing may be supported by the sliding hinge pin support plate. The hinge pin allows the second portion of the housing to rotate relative to the plate and first housing portion. When the first and second housing portions are folded together, the support plate may slide relative to the first housing portion, thereby moving the hinge pin relative to the first housing portion. This helps to ensure that links in the hinge structures are smoothly wrapped around a curved surface on the second housing surface as the device is folded. A bent portion of the display may rest on an outwardly facing surface of the hinge structures when the display is folded.

DETAILED DESCRIPTION

An electronic device may have a display. The display may have an array of pixels for displaying images for a user. The display may be an organic light-emitting diode display, a micro-light-emitting diode display formed from an array of crystalline semiconductor light-emitting diode dies, and/or may be any other suitable display. A two-dimensional touch sensor such as a capacitive touch sensor or other touch sensor may be incorporated into the display (e.g., by forming capacitive sensor electrodes from thin-film display circuitry) and/or a touch sensor layer may be laminated to an array of pixels in the display.

The display of the electronic device may be operated in unexpanded and expanded configurations. In the unexpanded configuration, portability of the device is enhanced. In the expanded configuration, viewable display area is increased, making it easier to provide touch input and to view images on the display.

Figure 1:
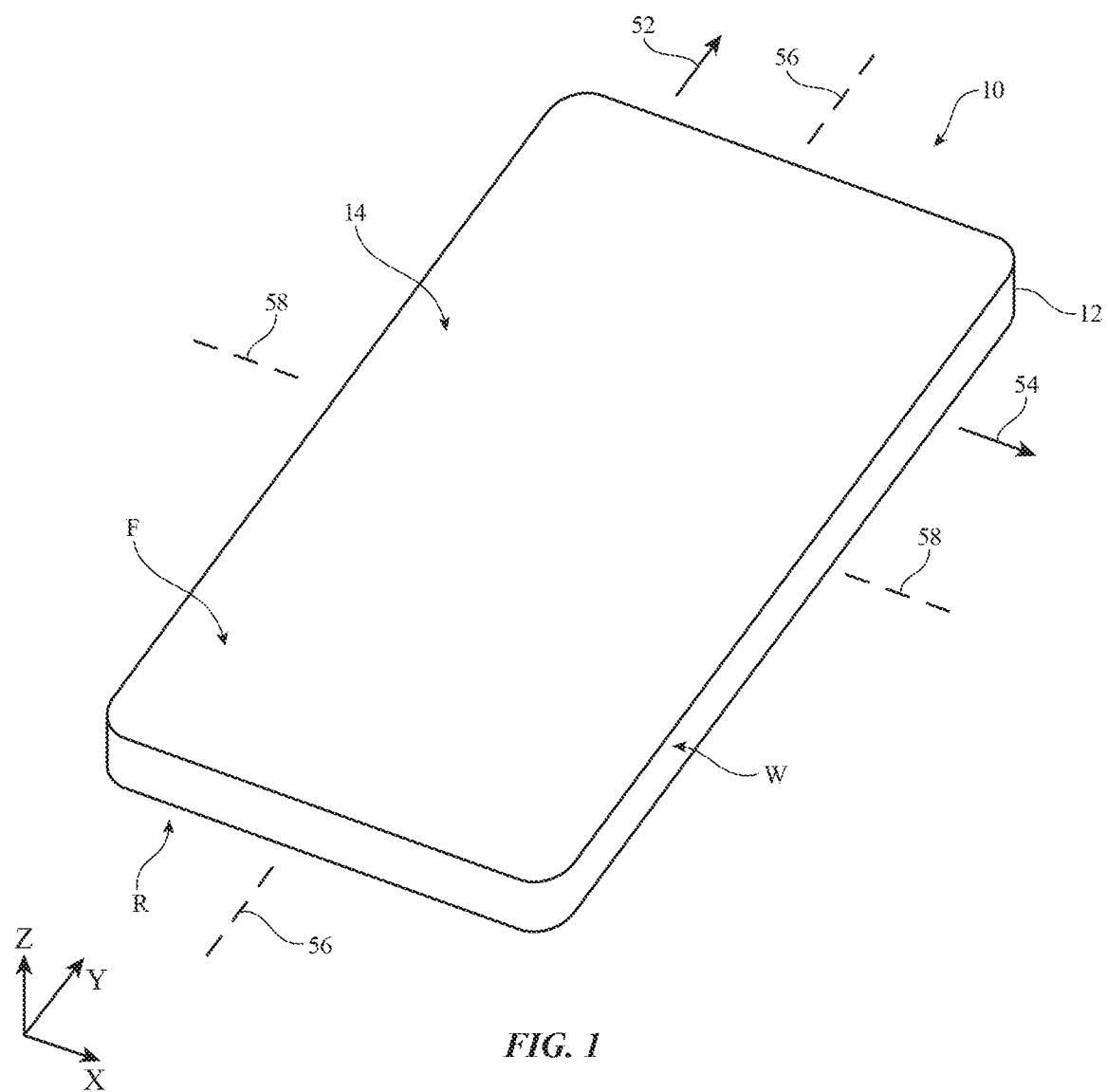
FIG. 1 is perspective view of an illustrative electronic device in accordance with an embodiment.

A perspective view of an illustrative electronic device of the type that may include an expandable display is shown in FIG. 1. Device 10 may be a laptop computer, a computer monitor containing an embedded computer, a tablet computer, a desktop computer, a cellular telephone, a media player, or other handheld or portable electronic device, a smaller device such as a wristwatch device, a wristband device, a pendant device, a headphone or earpiece device, a head-mounted device such as glasses, goggles, a helmet, or other equipment worn on a user's head, or other wearable or miniature device, a television, a computer display that does not contain an embedded computer, a gaming device, a navigation device, an embedded system such as a system in which equipment is mounted in a kiosk, in an automobile, airplane, or other vehicle, a removable external case for electronic equipment, an accessory such as a remote control, computer mouse, track pad, wireless or wired keyboard, or other accessory, and/or equipment that implements the functionality of two or more of these devices. In the illustrative configuration of FIG. 1, device 10 is a portable electronic device such as a cellular telephone or tablet. This configuration may sometimes be described herein as an example.

As shown in FIG. 1, device 10 may have a housing such as housing 12. Housing 12 may be formed from materials such as polymer, glass, metal, crystalline materials such as sapphire, ceramic, fabric, foam, wood, other materials, and/or combinations of these materials. Device 10 may have any suitable shape. In the example of FIG. 1, device 10 has front face F, opposing rear face R, and sidewall portions (sidewalls) W. Portions W may be formed as extensions of the housing structures on front face F, rear face R, and/or may be formed using one or more separate sidewall members (as examples). Sidewall structures may be planar (e.g., to form vertical sidewalls extending between front F and rear R) and/or may have curved cross-sectional profiles. Input-output devices such as one or more buttons may be mounted on housing 12 (e.g., on sidewall portions W).

Device 10 may have one or more displays such as display 14. In the example of FIG. 1, display 14 covers front face F. Display 14 may also be mounted on other portions of device 10. For example, one or more displays such as display 14 may cover all of front face F, part of front face F, some or all of rear face R, and/or some or all of sidewalls W. In some configurations, some or all of display 14 may be covered with flexible or rigid transparent members that serve as protective display cover layers. Such transparent display cover layer structures, which may sometimes be referred to as housing structures, may overlap at least some of display 14 and may serve as a display cover layer. If desired, transparent thin-film structures may serve as protective display layers (e.g., scratch-resistance layers, oleophobic anti-smudge coating layers, etc.).

Display 14 may have a planar shape, a shape with a curved cross-sectional profile, or other suitable shape. In the example of FIG. 1, front face F has a planar shape and lies in the X-Y plane. Display 14 may have a rectangular footprint (outline when viewed from above) or other suitable footprint. Device 10 is elongated along longitudinal axis 56 (e.g., parallel to the Y axis of FIG. 1). The thickness of device 10 in dimension Z, may be less than the width of device 10 in dimension X and less than the length of device 10 in dimension Y (as an example).

To help accommodate a user's desire for compactness while accommodating a user's desire for large amounts of display real estate, device 10 can have structures that allow the shape and size of device 10 and display 14 to be adjusted. In particular, device 10 may have a display and associated housing structures that support folding motions, sliding motions, scrolling motions, and/or other behavior that allows device 10 to be adjusted during use.

When compact size is desired, device 10 can be adjusted to be compact. Device 10 and display 14 may, as an example, be folded inwardly or outwardly about bend axis 58. As another example, sliding or scrolling display structures can be retracted so that device size is minimized.

When a large screen size is desired, device 10 and display 14 can be unfolded (in a configuration in which device 10 is foldable) or display 14 can be expanded laterally in one or more directions such as direction 52 (parallel to longitudinal axis 56) or direction 54 (e.g., a lateral direction that is perpendicular to longitudinal axis 56 and perpendicular to the thickness of device 10). Device 10 and display 14 may, for example, be expanded by sliding portions of device 10 (and display 14) along axis 56 or axis 58 or by unscrolling a scrolled flexible display in direction 52 or direction 54.

When expanded, display 14 exhibits an expanded viewable area. In particular, the portion of display 14 that is viewable by a user of device 10 when device 10 is expanded (sometimes referred to as the expanded viewable area of display 14) is larger than the unexpanded viewable area of display 14 that is presented to a user of device 10 when device 10 is unexpanded. In general, device 10 may use any suitable arrangement that allows display and/or device size and/or shape to be adjusted (e.g., between a first configuration such as an unexpanded viewable area configuration in which a first amount of display 14 is visible to a user viewing the front face of device 10 or other side of device 10 and a second configuration such as an expanded viewable area configuration in which a second amount of display 14 that is greater than the first amount is visible to a user viewing the front face of device 10 or other side of device 10). These arrangements may exhibit inward and/or outward folding, scrolling, sliding, and/or other housing and display movements as device 10 and display 14 are transitioned between unexpanded and expanded states.

Figure 2:
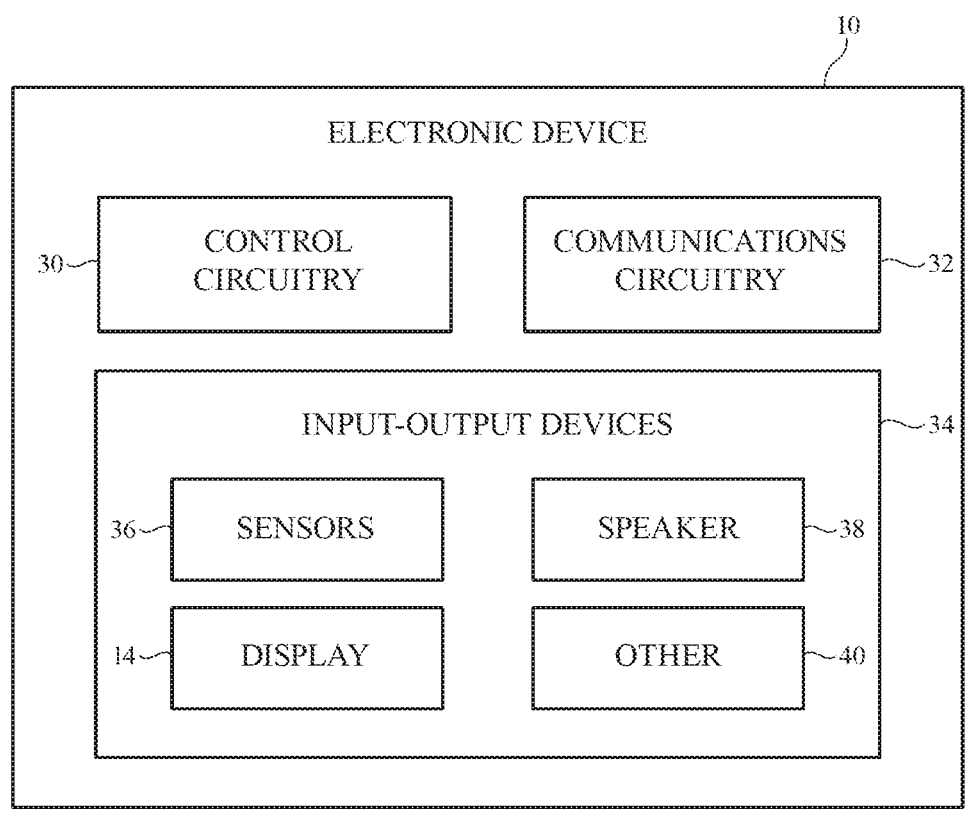
FIG. 2 is a schematic diagram of an illustrative electronic device in accordance with an embodiment.

A schematic diagram of an illustrative electronic device is shown in FIG. 2. As shown in FIG. 2, device 10 may include control circuitry 30, communications circuitry 32, and input-output devices 34.

Control circuitry 30 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 30 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external electronic equipment, control circuitry 30 may communicate using communications circuitry 32. Communications circuitry 32 may include antennas, radio-frequency transceiver circuitry, and other wireless communications circuitry and/or wired communications circuitry. Circuitry 32, which may sometimes be referred to as control circuitry and/or control and communications circuitry, may, for example, support wireless communications using wireless local area network links, near-field communications links, cellular telephone links, millimeter wave links, and/or other wireless communications paths.

Input-output devices 34 may be used in gathering user input, in gathering information on the environment surrounding the user, and/or in providing a user with output.

Display 14 of input-output devices 34 has an array of pixels for displaying images to users. Display 14 may be a light-emitting diode display (e.g., an organic light-emitting diode or a display with a pixel array having light-emitting diodes formed from crystalline semiconductor dies), an electrophoretic display, a liquid crystal display, or other display. Display 14 may include a two-dimensional capacitive touch sensor or other touch sensor for gathering touch input. Display 14 may have a substrate formed from a flexible dielectric (e.g., a sheet of polyimide or other bendable polymer layer) and/or may have rigid substrate structures. Flexible display arrangements may be used to provide display 14 with the ability to alter size and shape by folding, scrolling, sliding, etc. If desired, some or all of display 14 may include rigid (non-flexible) display structures.

Devices 34 may include sensors 36. Sensors 36 may include force sensors (e.g., strain gauges, capacitive force sensors, resistive force sensors, etc.), audio sensors such as microphones, capacitive touch sensors, capacitive proximity sensors, non-capacitive touch sensors, ultrasonic sensors, sensors for detecting position, orientation, and/or motion (e.g., accelerometers, magnetic sensors such as compass sensors, gyroscopes, and/or inertial measurement units that contain some or all of these sensors), muscle activity sensors (EMG), heart rate sensors, electrocardiogram sensors, and other biometric sensors, radio-frequency sensors (e.g., radar and other ranging and positioning sensors), humidity sensors, moisture sensors, and/or other sensors.

Sensors 36 and other input-output devices 34 may include optical components such as light-emitting diodes (e.g., for camera flash or other blanket illumination, etc.), lasers such as vertical cavity surface emitting lasers and other laser diodes, laser components that emit multiple parallel laser beams (e.g., for three-dimensional sensing), lamps, and light sensing components such as photodetectors and digital image sensors. For example, sensors 36 in devices 34 may include optical sensors such as depth sensors (e.g., structured light sensors and/or depth sensors based on stereo imaging devices that can optically sense three-dimensional shapes), optical sensors such as self-mixing sensors and light detection and ranging (lidar) sensors that gather time-of-flight measurements and/or other measurements to determine distance between the sensor and an external object and/or that can determine relative velocity, monochromatic and/or color ambient light sensors that can measure ambient light levels, proximity sensors based on light (e.g., optical proximity sensors that include light sources such as infrared light-emitting diodes and/or lasers and corresponding light detectors such as infrared photodetectors that can detect when external objects are within a predetermined distance), optical sensors such as visual odometry sensors that gather position and/or orientation information using images gathered with digital image sensors in cameras, gaze tracking sensors, visible light and/or infrared cameras having digital image sensors configured to gather image data, optical sensors for measuring ultraviolet light, and/or other optical sensor components (e.g., light sensitive devices and, if desired, light sources), photodetectors coupled to light guides, associated light emitters, and/or other optical components (one or more light-emitting devices, one or more light-detecting devices, etc.).

Input-output devices 34 may also include audio components. The audio components may include one or more microphones to sense sound (e.g., an audio sensor in sensors 36 to sense audio signals) and may include sound-emitting components such as tone generators and one or more speakers. As shown in FIG. 2, for example, input-output devices 34 may include speaker 38. Speakers may be used to support speaker-phone operations and/or may be used as ear speakers when device 10 is being held to a user's ear to make a telephone call, to listen to a voicemail message, or to listen to other audio output.

In addition to sensors 36, display 14, and speaker 38, input-output devices 34 may include user input devices such as buttons and other devices 40. Devices 40 may include, for example, optical components such as light-based output devices other than display 14 that are used to provide visual output to a user. The light-based output devices may include one or more light-emitting diodes, one or more lasers, lamps, electroluminescent devices, and/or other light emitting components. The light-based output devices may form status indicator lights. If desired, the light-based output devices may include illuminated icons (e.g., backlight symbols associated with power indicators, battery charge indicators, wireless signal strength indicators, notification icons, etc.).

Devices 40 may include electromagnets, permanent magnets, structures formed from magnetic material (e.g., iron bars or other ferromagnetic members that are attracted to magnets such as electromagnets and/or permanent magnets), batteries, etc. Devices 40 may also include power transmitting and/or receiving circuits configured to transmit and/or receive wired and/or wireless power signals and output components such as haptic output devices and other output components (e.g., electromagnetic actuators or other actuators that can vibrate to provide a user with a haptic alert and/or haptic feedback associated with operation of a touch sensor or other input devices).

Figure 3:
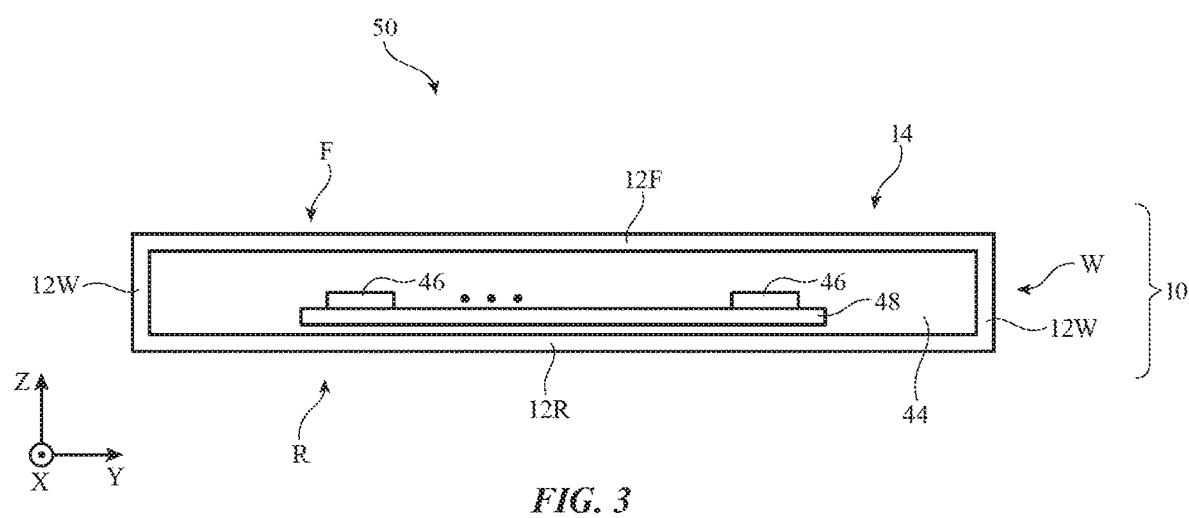
FIG. 3 is a cross-sectional side view of an illustrative electronic device in accordance with an embodiment.

A cross-sectional side view of device 10 of FIG. 1 is shown in FIG. 3. As shown in FIG. 3, housing 12 may have one or more portions such as sidewall portions 12W, front portion 12F on front face F of device 10, and rear portion 12R on rear face R of device 10. These portions may be formed from metal (e.g., aluminum, stainless steel, or other metals) or may be formed from polymer, glass, ceramic, and/or other materials.

Display 14 may be visible on front face F of device 10 and/or other portions of device 10. For example, a viewer who is viewing device 10 in the −Z direction of FIG. 3 (e.g., a user viewing device 10 from the front) may view the pixels of display 14 on front face F that face the user in the +Z direction). Display 14 may be overlapped by transparent portions of housing 12, may have portions that are supported on the outermost surface of housing 12, and/or may have portions that protrude from housing 12. In some configurations, rigid protective transparent materials may form a display cover layer that protects display 14. Display 14 may also be protected by attaching protective thin films to the outermost surface of display 14 and/or by incorporating protective thin films into display 14. As an example, a clear polymer film may overlap the pixels of display 14 to help protect the circuitry of the pixels from damage and/or thin-film organic and/or inorganic layers may be incorporated into display 14 to help protect display 14. In some arrangements, display 14 may include flexible protective material (e.g., a bendable polymer thin film, bendable inorganic thin-film layers, etc.). Transparent materials that may overlap display 14 (e.g., to protect display 14) may be formed from sapphire or other crystalline material, glass, polymer, transparent ceramic, inorganic dielectric materials such as transparent metal oxide thin films and/or other inorganic materials, and/or other transparent material and/or other flexible and/or rigid transparent materials.

The walls of housing 12 may separate interior region 44 of device 10 from exterior region 50 surrounding device 10. Interior region 44 may include electrical components such as components 46. Components 46 may include integrated circuits, discrete components, a battery, wireless circuit components such as a wireless power coil, and/or other components (see, e.g., control circuitry 30, communications circuitry 32, and input-output devices 34 of FIG. 2). Components 46 may be interconnected using signal paths such as paths formed from traces on printed circuits (see, e.g., printed circuit 48).

To accommodate the sometimes competing desires for compact device size and large screen size, device 10 can be adjusted between a first state in which display 14 is unexpanded and a second state in which display 14 is expanded and therefore larger than when unexpanded.

Figure 4:
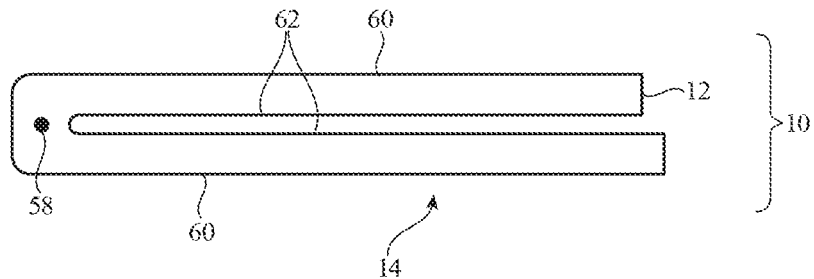
FIG. 4 is side view of an illustrative electronic device with a foldable display in accordance with an embodiment.

With one illustrative arrangement, device 10 accommodates display bending. Display 14 may, for example, be folded inwardly so that left and right halves of display 14 face each other (e.g., when display 14 is formed on surface 62 of housing 12 of FIG. 4). Display 14 may also be folded outwardly so that left and right halves of display 14 face away from each other (e.g., when display 14 is formed on surface 60 of housing 12 of FIG. 4). If desired, device 10 may support both inward and outward folding.

Figure 5:
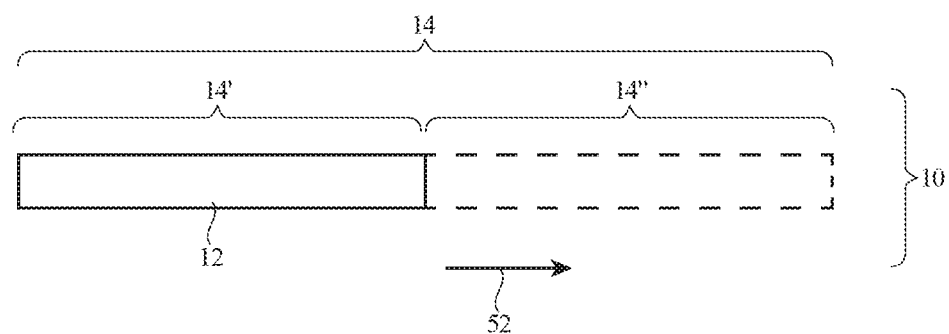
FIG. 5 is a side view of an illustrative electronic device with a sliding display in accordance with an embodiment.

Arrangements in which device 10 allows display 14 to be changed in size using sliding motions may also be used. As shown in FIG. 5, for example, device 10 may be adjusted so that structures in device 10 and display 14 slide (in direction 52 or other suitable direction) between a first (unexpanded) configuration in which only display area 14' is visible and a second (expanded) configuration in which both display area 14' and display area 14" are visible.

Figure 6:
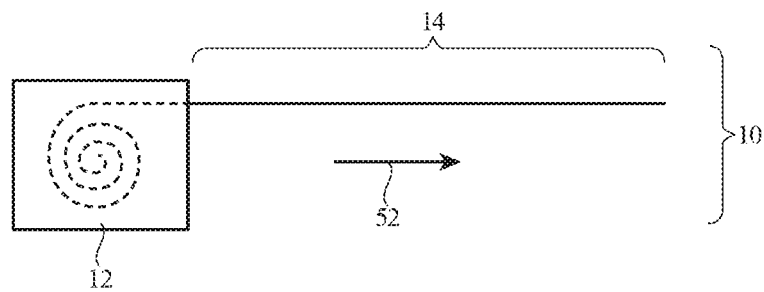
FIG. 6 is a side view of an illustrative electronic device with a scrolling display in accordance with an embodiment.

FIG. 6 is a side view of device 10 in an illustrative configuration in which display 14 is sufficiently flexible to be scrolled. This allows display 14 to move in and out of housing 12. In an unexpanded configuration, display 14 is rolled up and stored in housing 12 of FIG. 6. In an expanded configuration, display 14 is enlarged by unscrolling display 14 in direction 52 and causing display 14 to extend out of housing 12. Other arrangements that allow display 14 to be changed in size and/or shape may also be used and/or combinations of these arrangements and/or the arrangements of FIGS. 4, 5, and 6 may be used.

Figure 7:
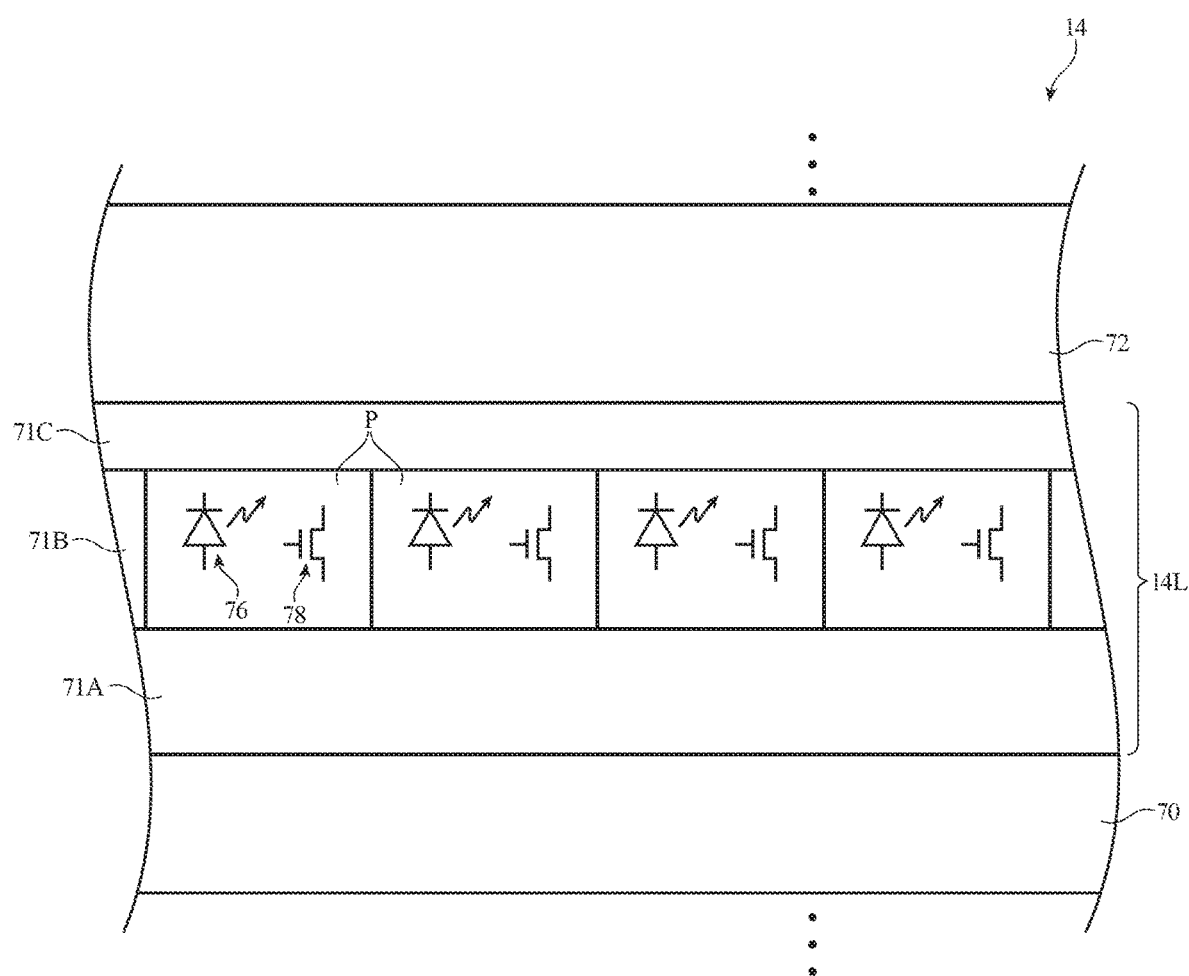
FIG. 7 is a cross-sectional side view of an illustrative flexible display structure in accordance with an embodiment.

If desired, display 14 may have an array of light-emitting pixels P. This type of arrangement is shown in FIG. 7. In the example of FIG. 7, display 14 includes display layer 14L. Display layer 14L may be flexible and may sometimes be referred to as a flexible display or flexible pixel array. As shown in FIG. 7, display layer 14L may include substrate 71A, a layer of pixels forming pixel array 71B, and covering layer 71C.

Substrate 71A may be formed from a sheet of polyimide or other flexible polymer layer or may be formed from a layer of dielectric material (e.g., flexible glass or rigid glass in configurations in which substrate 71A or portions of substrate 71A include rigid substrate material). Substrate 71A may be covered by thin-film layers forming pixels P and other thin-film circuitry. Pixels P may include thin-film transistors 78, thin-film capacitors, thin-film light-emitting diodes 76 such as organic light-emitting diodes, and/or other thin-film circuitry. If desired, an array of pixels P for display 14 may be formed from micro-light-emitting diodes (sometimes referred to as microLEDs) formed from crystalline semiconductor dies. These dies may be mounted on a dielectric substrate such as a flexible dielectric substrate. One or more encapsulation layers such a layer 71C may be used to protect and environmentally seal pixels P. Layer(s) 71C may include organic and/or inorganic dielectric layers (e.g., thin-film layers).

Display 14 may include additional layers such as one or more support layers on the rear of display layer 14L (see, e.g., backing layer 70) and/or one or more outwardly facing layers on the outwardly facing side of display layer 14L (see, e.g., layer 72). These layers may be attached above and below display layer 14L using layers of adhesive, using other coupling structures, by forming thin-film layers directly on display 14, and/or by incorporating other layers overlapped by pixels P into display 14. Backing layers such a layer 70 may be formed from metal (e.g., thin flexible metal that can withstand repeated bending and unbending), may be formed from polymer, may be formed from other materials, and/or may be formed from combinations of these materials. During bending, layers such as layer 70 may help protect display 14 from wrinkling or other potentially damaging deformation. Additional layer(s) 72 may include polarizer layers, wave plates, filters, protective cover layers, privacy films, and/or other display layers.

Figure 8:
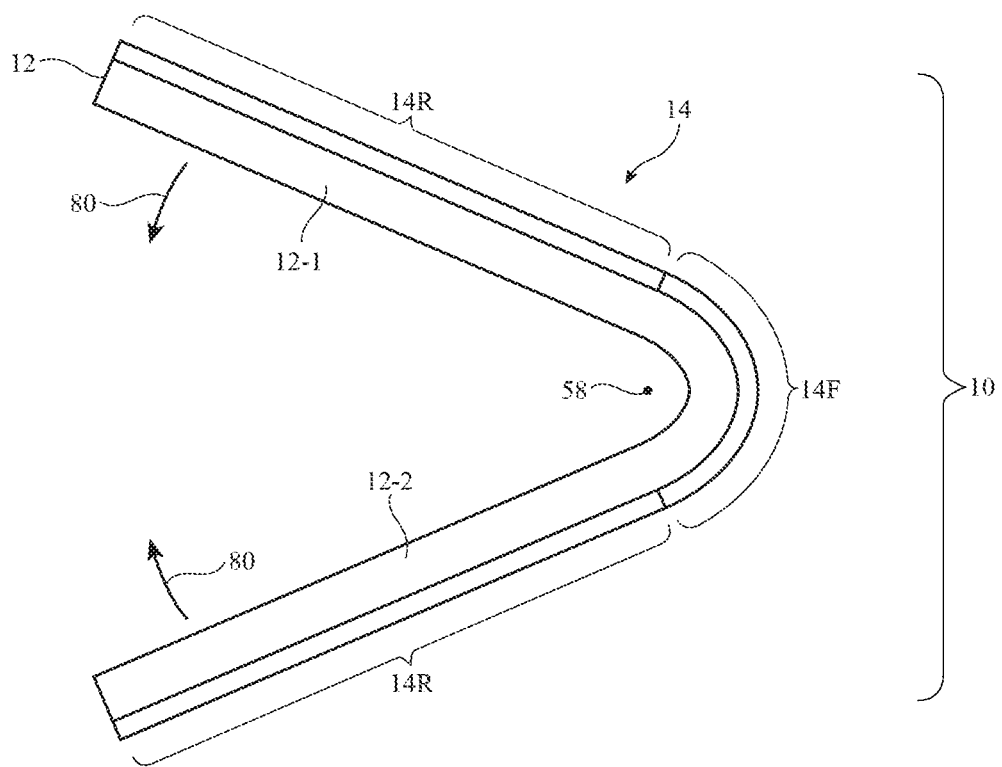
FIG. 8 is a cross-sectional side view of an illustrative electronic device with a folding display in accordance with an embodiment.

FIG. 8 is a cross-sectional side view of an illustrative electronic device with a display that is expandable using a folding motion. In the example of FIG. 8, display 14 is located on the outer surface of housing 12 as device 10, housing 12, and display 14 bends about bend axis 58. If desired, device 10, housing 12, and display 14 may support inward bending. The location of bend axis 58 need not be fixed and may change dynamically as device 10 folds. For example, when bending motion starts with very large curvature (e.g., a large bending radius), bend axis 58 may be far away from device 10, whereas when the bending motion is being completed, bend axis 58 may be close to device 10.

Display 14 may be a unitary flexible display (e.g., a flexible organic light-emitting diode panel or microLED display with a flexible substrate) or display 14 may have rigid and flexible portions such as central flexible portion 14F and outer rigid portions 14R of display 14 of FIG. 8. Flexible substrates for display 14 may, if desired be stretchable. A flexible portion of display 14 (e.g., portion 14F) overlaps bend axis 58 (which extends into the page in the example of FIG. 8), thereby allowing display 14 to bend about bend axis 58 as housing portions 12-1 and 12-2 are moved towards each other in directions 80.

Figure 9:
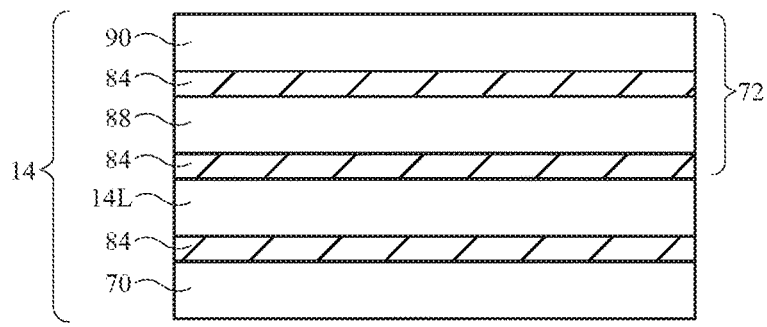
FIG. 9 is a cross-sectional side view of illustrative layers in a flexible display in accordance with an embodiment.

A cross-sectional side view of an illustrative display such as a flexible display is shown in FIG. 9. As shown in FIG. 9, display 14 may have multiple layers that are stacked on top of each other. The layers of display 14 may be attached to each other using coupling structures such as adhesive layers 84 (as an example). Adhesive layers 84 may be formed from solid sheets of adhesive (e.g., polymer adhesive) and/or may be formed from adhesive patterned to form a grid, islands (e.g., columns of adhesive), strips of adhesive, etc.

Supportive backing layer 70 may be used to provide support to the layers of display 14. Layer 70 may be formed from polymer, metal (e.g., flexible metal such as spring metal), and/or other materials. For example, layer 82 may be a metal backing film that helps prevent wrinkling or other undesired deformation in display 14 as display 14 is bent. Layer 70 may be attached to the inner surface of display layer 14L by one of adhesive layers 84. Additional layers 72 may be coupled to the outer surface of display layer 14L by another of adhesive layers 84. Additional layers 72 may include, for example, a polarizer such as circular polarizer 88 to suppress ambient light reflections from display layer 14L and protective layer 90. One of adhesive layers 84 may be used to couple layers 90 and 88.

Figure 10:
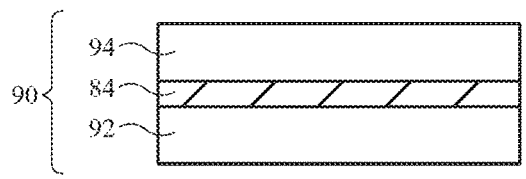
FIG. 10 is a cross-sectional side view of illustrative layers in a protective layer for a display in accordance with an embodiment.
Figure 11:
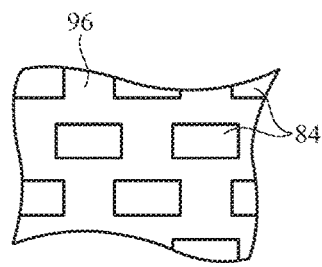
FIG. 11 is a top view of a layer of an illustrative display showing how isolated columns of adhesive may be used in coupling sublayers in the layer together in accordance with an embodiment.

Layer 90 may be formed from a single layer of glass (e.g., a glass layer having a thickness of 30-100 microns, at least 10 microns, at least 20 microns, at least 40 microns, at least 50 microns, at least 100 microns, at least 200 microns, at least 300 microns, less than 250 microns, less than 150 microns, less than 75 microns, less than 40 microns, less than 15 microns, or other sufficiently low value to allow layer 90 to flex), a flexible layer of polymer, a transparent layer formed from other materials, and/or a composite layer formed from multiple layers of material. In the example of FIG. 10, layer 90 is formed from an upper layer of polymer such as upper layer 94 and a lower layer of glass such as layer 92. Adhesive layer 84 may be used to couple layers 92 and 94 together. As shown in the illustrative top view of patterned adhesive layer 84 of FIG. 11, adhesive layer 84 can be patterned so that adhesive 84 only appears in isolated islands (columns) surrounded by gaps 96 that are filled with gaseous or liquid fluid 96 (e.g., pillars of adhesive may be separated by air gaps or gaps filled with other gas or liquid). The islands of adhesive in a patterned adhesive layer 84 may have lateral dimensions of 10-100 microns, more than 20 microns, less than 500 microns, or other suitable size. Solid and/or patterned adhesive layers 84 may be soft to allow the layers of display 14 to shift (exhibit shearing motion) with respect to each other during display bending, thereby reducing stress. As an example, the adhesive material used in forming adhesive layer 84 may have a modulus of 10 kPa or lower.

Figure 12:
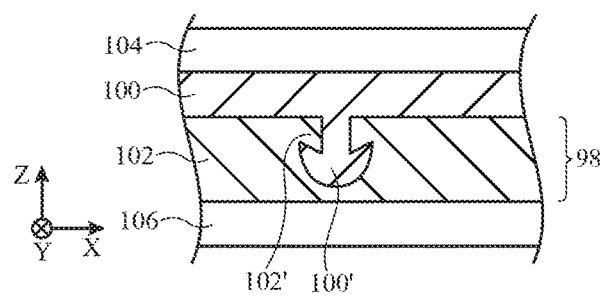
FIGS. 12 and 13 are cross-sectional side views of portions of a flexible display with interlocking sliding structures coupled between adjacent display layers in accordance with an embodiment.
Figure 13:
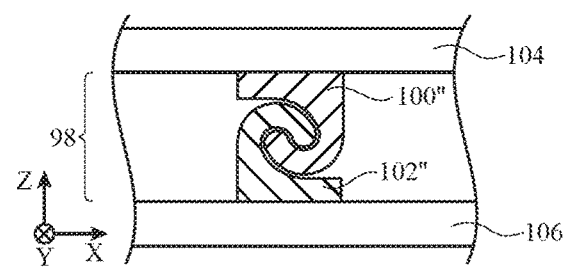

To help reduce stress buildup and damage to display 14 during bending, one or more of the layers of display 14 may be attached using structures that couple the layers to each other in the vertical (Z) dimension (layer-to-layer coupling) while allowing shearing movement along a dimension that is perpendicular to bend axis 58 (e.g., along the Y dimension). Illustrative structures that allow shear movements while coupling adjacent layers in display 14 to each other are shown in FIGS. 12 and 13. In the example of FIG. 12, the display includes upper layer 104 and lower layer 106. Layers 104 and 106 may, in general, include any layers of the type shown in FIG. 9 and/or other covering and/or supportive display layers. As an example, layer 104 may include an organic light-emitting diode panel and layer 106 may include one or more supporting layers. As shown in FIG. 12, layer 104 may be coupled to layer 100 and layer 106 may be coupled to layer 102. Layers 100 and 102 form a shearing attachment layer (layer 98) that permits movement along the Y dimension as display 14 is bent about a bend axis that runs parallel to the X dimension. Protruding portion 100' of layer 100 may have a shape that engages with surrounding portions 102' of layer 102 and thereby helps hold layer 100 to layer 102 in the Z dimension. Layers 100 and 102 may be formed from flexible polymers and may have coatings of lubricant and/or may be formed from slippery materials (e.g., polytetrafluoroethylene) to prevent layers 100 and 102 from binding. Other interlocking shapes may be used for the structures of layer 98, if desired (e.g., layer 106 may have protruding portions in addition to or instead of providing protrusions 100' in layer 100). FIG. 13 shows how downward protrusions such as structures 100" may interlock with upward protrusions such as structures 102". Remaining portions of layer 98 may be filled with fluid (liquid or gas) and/or lubricant (e.g., oil, lubricating particles, etc.). If desired, conductive material (e.g., metal layers, etc.) may be used in forming one or more of the layers of FIGS. 12 and 13. This allows an electrostatic force clutch mechanism to be implemented. When no electric field is applied to opposing conductive layers, there is no electrostatic force and the layers are free to slip relative to each other, thereby allowing device 10 to bend. When a non-zero control voltage is applied to opposing conductive layers, an electric field develops that holds the otherwise slippery layers in place. By preventing the layers from sliding past each other using applied electrostatic force, the clutch mechanism can effectively lock device 10 and prevent bending.

Figure 14:
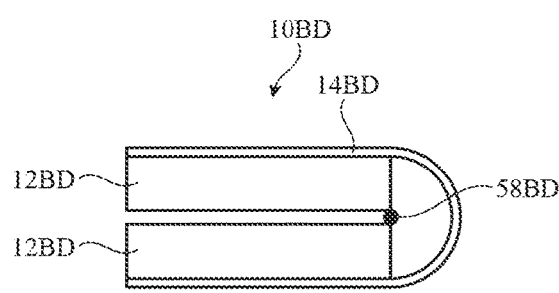
FIG. 14 is a cross-sectional side view of an illustrative electronic device with a folded display in an unexpanded configuration in accordance with an embodiment.
Figure 15:
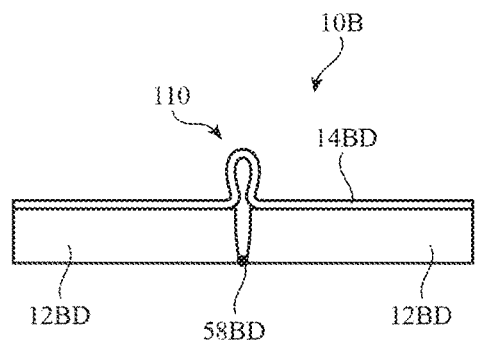
FIG. 15 is a cross-sectional side view of the illustrative electronic device of FIG. 14 is an expanded configuration in accordance with an embodiment.

To prevent undue stress in display 14 when a device is folded, device 10 may be provided with hinge structures that prevent kinks and other undesired features from developing in display 14 as portions of device 10 rotate about bend axis 58. This issue is illustrated in FIGS. 14 and 15. As shown by illustrative folding device 10BD of FIG. 14, device housing portions 12BD may fold about hinge axis 58BD to allow display 14BD to fold back on itself on the outer surfaces of device housing portions 12BD. But when this type of device is unfolded, there is a risk that display 14BD may be deformed in region 110 overlapping hinge axis 58BD.

Figure 16:
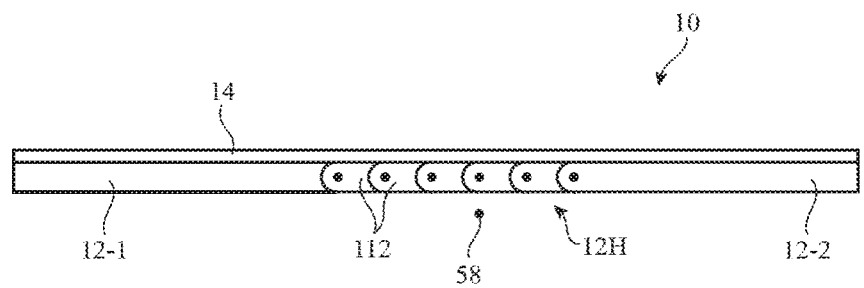
FIG. 16 is a cross-sectional side view of an illustrative flexible device having a segmented hinge in accordance with an embodiment.
Figure 17:
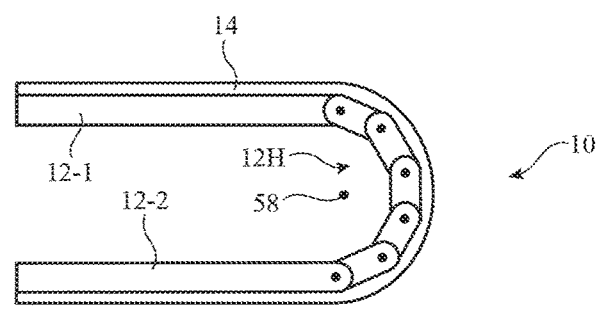
FIG. 17 is a cross-sectional side view of the illustrative flexible device of FIG. 16 in a folded configuration in accordance with an embodiment.

To avoid this issue, folding device 10 can be provided with hinge structures that do not impart undue display stress during folding and unfolding operations. Consider, as an example, the illustrative device configuration of FIG. 16. As shown in FIG. 16, device 10 may have a first housing portion 12L and a second housing portion 12R. Portions 12L and 12R may form first and second housing structures (e.g., a left housing member and a corresponding right housing member, upper and lower housing halves, etc.) and may, if desired, have hollow interiors that enclose batteries, control circuitry, input-output devices, and other device components. Hinge structures 12H may include multiple hinge links 112 and may be used in coupling portions 12L and 12R together. Display 14 may be supported on the outer or inner surface of housing portions 12L and 12R and may overlap bend axis 58. FIG. 17 shows how hinge structures 12H may support flexible display 14 and help prevent kinks and other undesired wrinkling features from developing in display 14 as device 10 is folded about bend axis 58.

Figure 18:
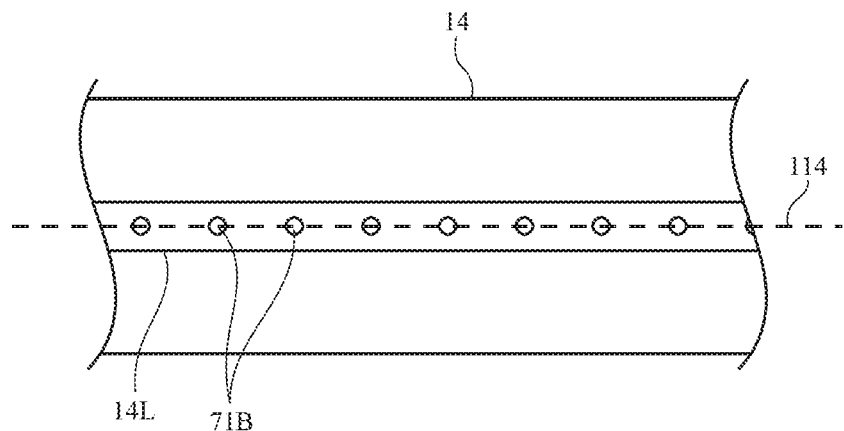
FIGS. 18 and 19 are cross-sectional side views of an illustrative flexible display showing how a reduced stress plane may be configured to coincide with an interior portion of the flexible display in alignment with a layer of thin-film pixels or other brittle display layers in accordance with an embodiment.
Figure 19:
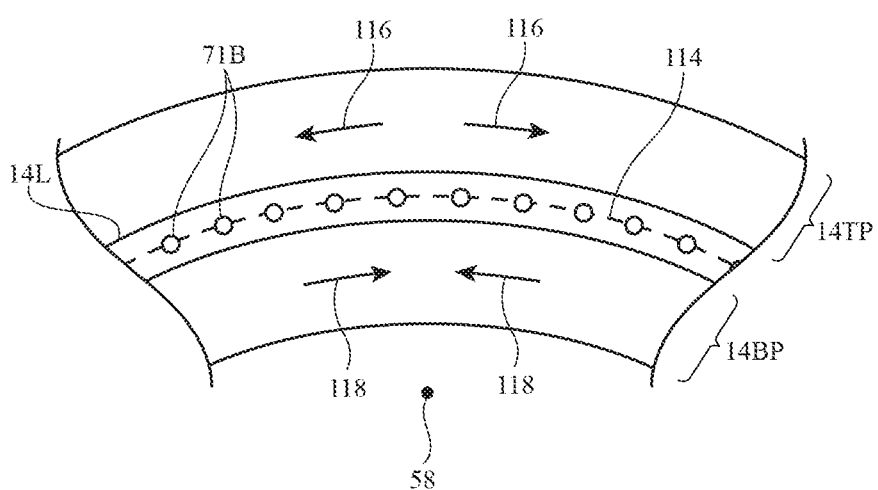

To help reduce stress during folding and unfolding, hinge structures 12H may be configured to ensure that stress is minimized within the thin-film structures of display 14. As shown in FIG. 18, for example, device 10 may be configured so that display 14 has a reduced stress plane 114 (e.g., a neutral stress plane or approximately neutral stress plane) that lies within the interior of display 14 (e.g., in alignment with pixel array 71B in display layer 14L of FIG. 7 or in line with other brittle display layers such as an encapsulation layer in display layer 14L or a display cover layer for display 14). When display 14 of FIG. 18 is bent about bend axis 58 as shown in FIG. 19, upper portion 14TP of display 14 may experience tensile stress as shown by arrows 116 and lower portion 14BP of display 14 may experience compressive stress as shown by arrows 118. Due to the positioning of reduced stress plane 114 within pixel array 71B, however, layer 14L and pixel array 71B will experience relatively small amounts of stress during bending.

Figure 20:
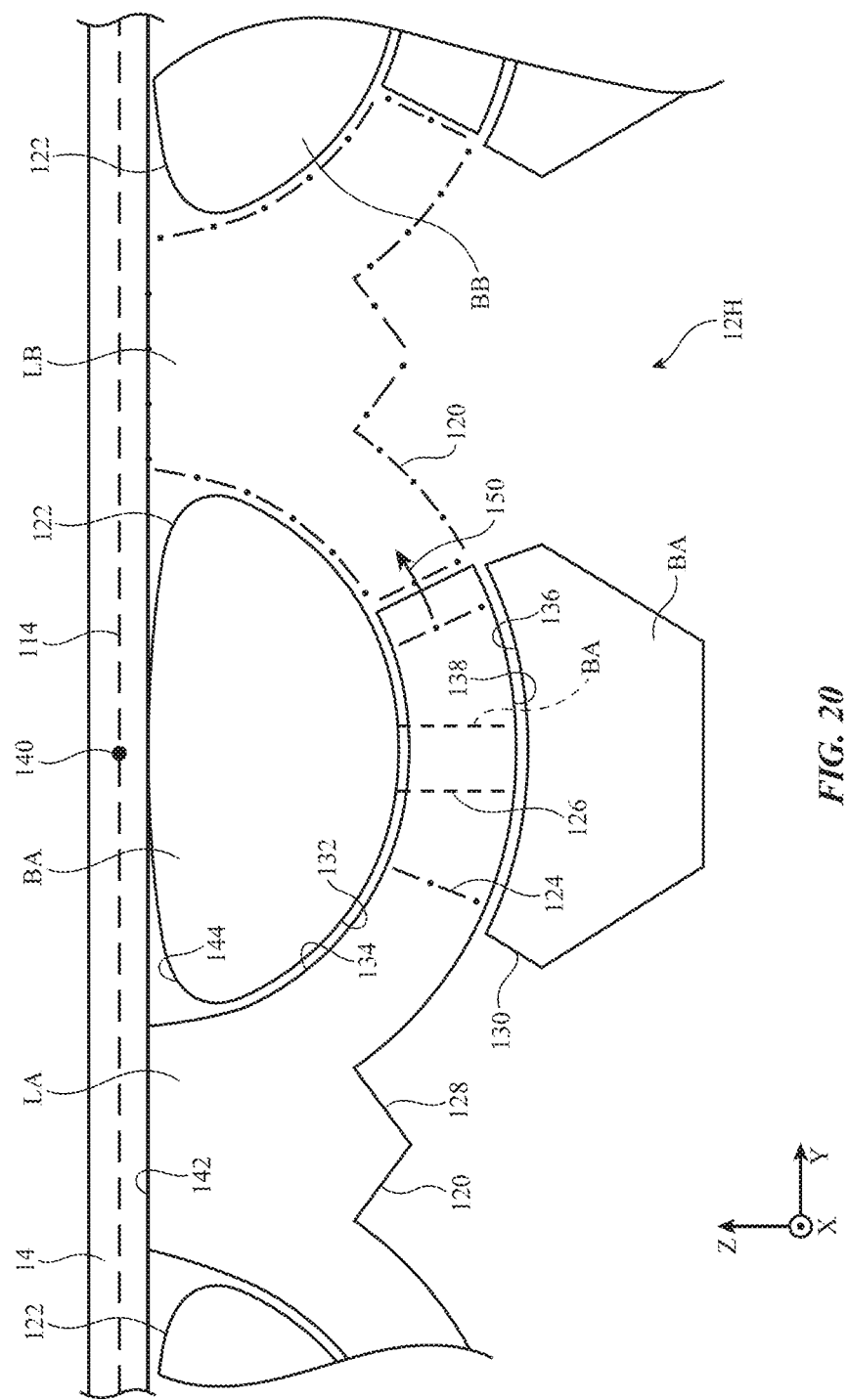
FIG. 20 is a cross-sectional side view of an illustrative electronic device with multilink hinge structures supporting a flexible display in accordance with an embodiment.

An illustrative hinge structure that may be used in device 10 to help position reduced stress plane 114 within display 14 (e.g., within display layer 14L and pixel array 71B) is shown in FIG. 20. In the example of FIG. 20, hinge structure 12H is a virtual pivot roller hinge having hinge members that rotate with respect to each other as device 10 is folder.

As shown in FIG. 20, hinge structure 12H may have a series of links 120 coupled by respective bars 122. Bars 122 may have portions that extend below the links and thereby hold the bars in place. For example, bar BA has an upper portion above links LA and a lower portion below link LA. Post portion 126 of bar BA couples the upper and lower portions of bar BA together. Post portion 126 moves within an opening within link LA. When display 14 is planar (e.g., when device 10 is in its expanded unfolded state, post portion 126 does not contact the sides of the opening. When display 14 and device 10 are bent about bend axis 58, the left side of post portion 126 may contact a stop surface such as stop surface 124, thereby preventing further bending of 124L and the right side of post portion 126 may contact right 124L. Stop surface 128 of link LA and stop surface 130 of the lower part of bar BA may also contact each other. When the stop surfaces contact each other in this way, additional bending will be stopped (e.g., to prevent excessive forward bending and to prevent back bending of hinge structures 12H).

The curved lower surfaces of the upper portions of bars 122 such as lower bar bearing surface 132 have profiles (circular arc profiles) that form parts of a circles and bear against opposing upwardly facing curved surfaces of links 120 (see, e.g., opposing circularly curved upper link bearing surface 134). Lower bar bearing surface 136 also has a circularly curved shape and bears against opposing curved lower bearing surface 138 of link A. The circular arcs formed from the cross-sectional profiles of these bearing surfaces allow links 120 and bars 122 to rotate with respect to each other about pivot points such as illustrative pivot point 140 for link LA and associated bar BA. In particular, the curved shapes of the bearing surfaces allow link LA to rotate about a rotational axis aligned with pivot point 140 when link LA is moved in direction 150 relative to bar BA. During rotation, link LA is not blocked by link LB, which lies out of the page in FIG. 20 (e.g., out of plane with respect to link LA).

Pivot points such as pivot point 140 may sometimes be referred to a virtual pivot points, because they do not lie within the bodies of bars 122 (as would be the case if links 120 formed chain links and bars 122 were formed from solid rods forming axles for the chain links). This allows pivot points such as pivot point 140 and associated reduced stress plane 114 to be located within display 14 (e.g., within layer 14L and aligned with pixels 71B or other brittle or otherwise stress-sensitive display layers as described in connection with FIGS. 18 and 19). By locating pivot points 140 and reduced stress plane 114 in alignment with pixels 71B or other brittle display layers in display 14, stress on pixels 71B or other brittle display layers can be reduced.

As shown in FIG. 20, display 14 may rest on upper surfaces 142 of links 120 and upper surfaces of bars 122. Surfaces 144 (and, if desired, surfaces 142) may have curved (e.g., slightly convex) cross-sectional profiles so that display 14 is smoothly and evenly supported when display 14 is in its bent configuration.

Figure 21:
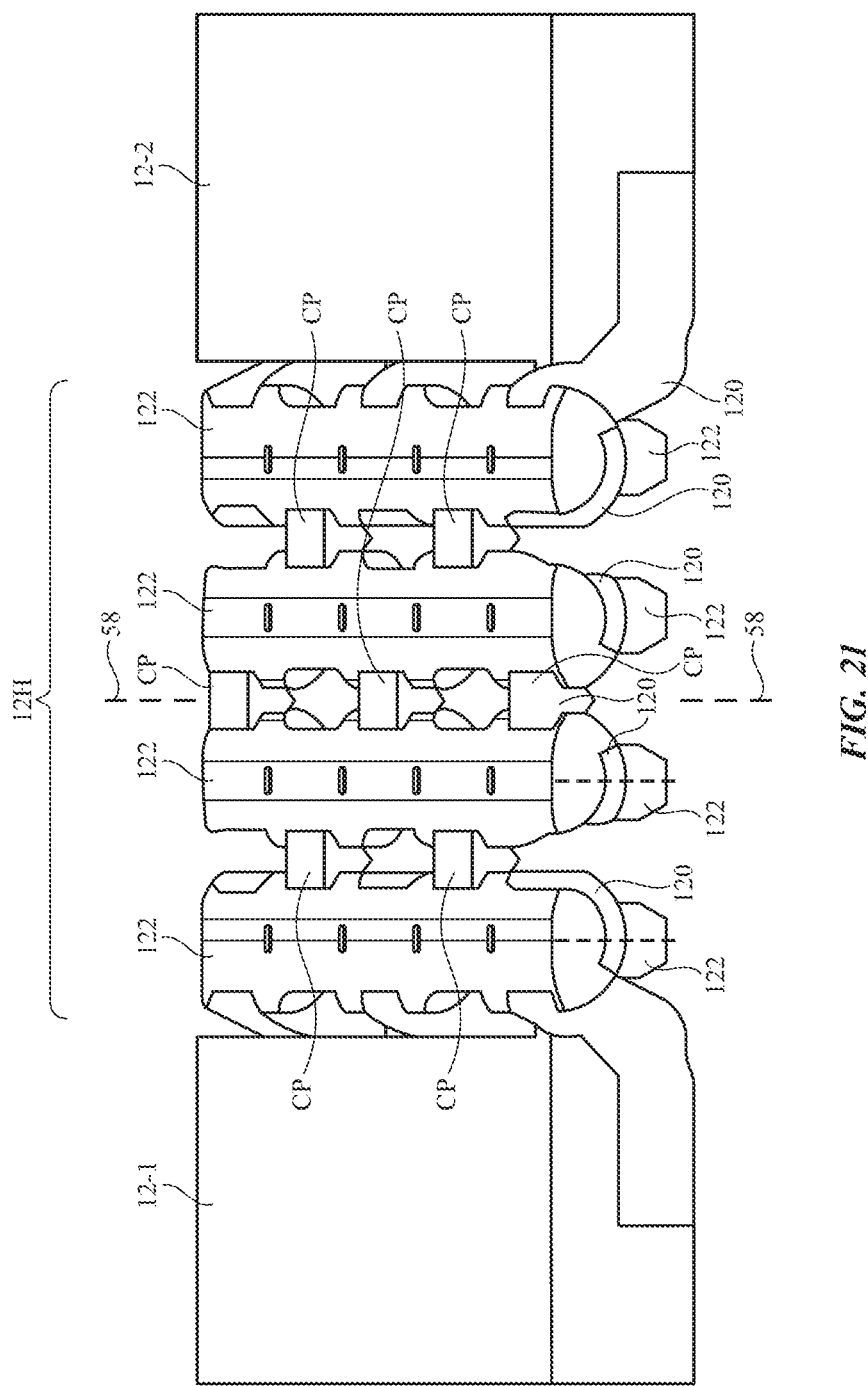
FIG. 21 is a perspective view of an illustrative foldable electronic device with a segmented hinge in accordance with an embodiment.
Figure 22:
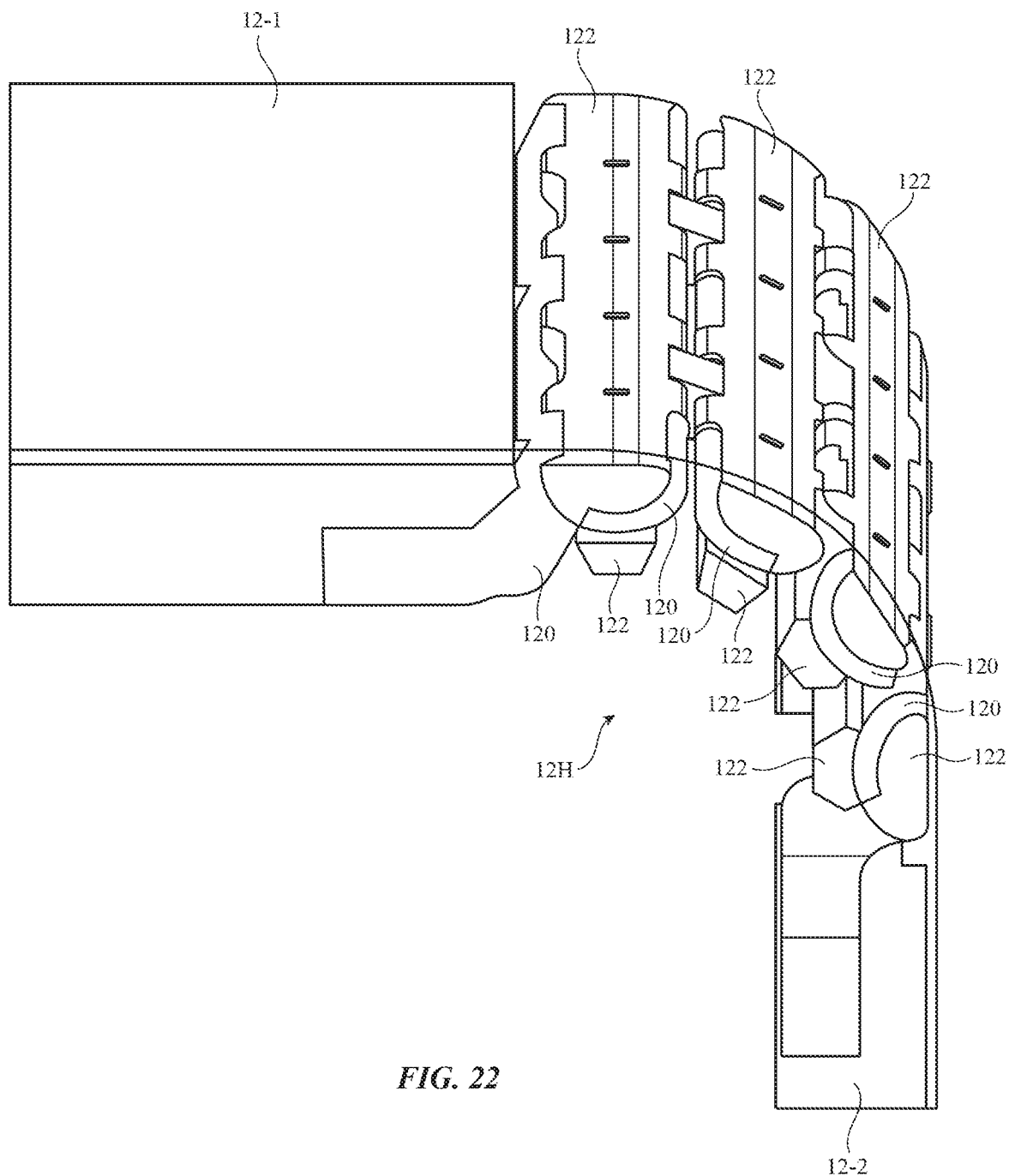
FIG. 22 is a perspective view of the illustrative device of FIG. 21 in a configuration in which the hinge has been bent at a right angle in accordance with an embodiment.
Figure 23:
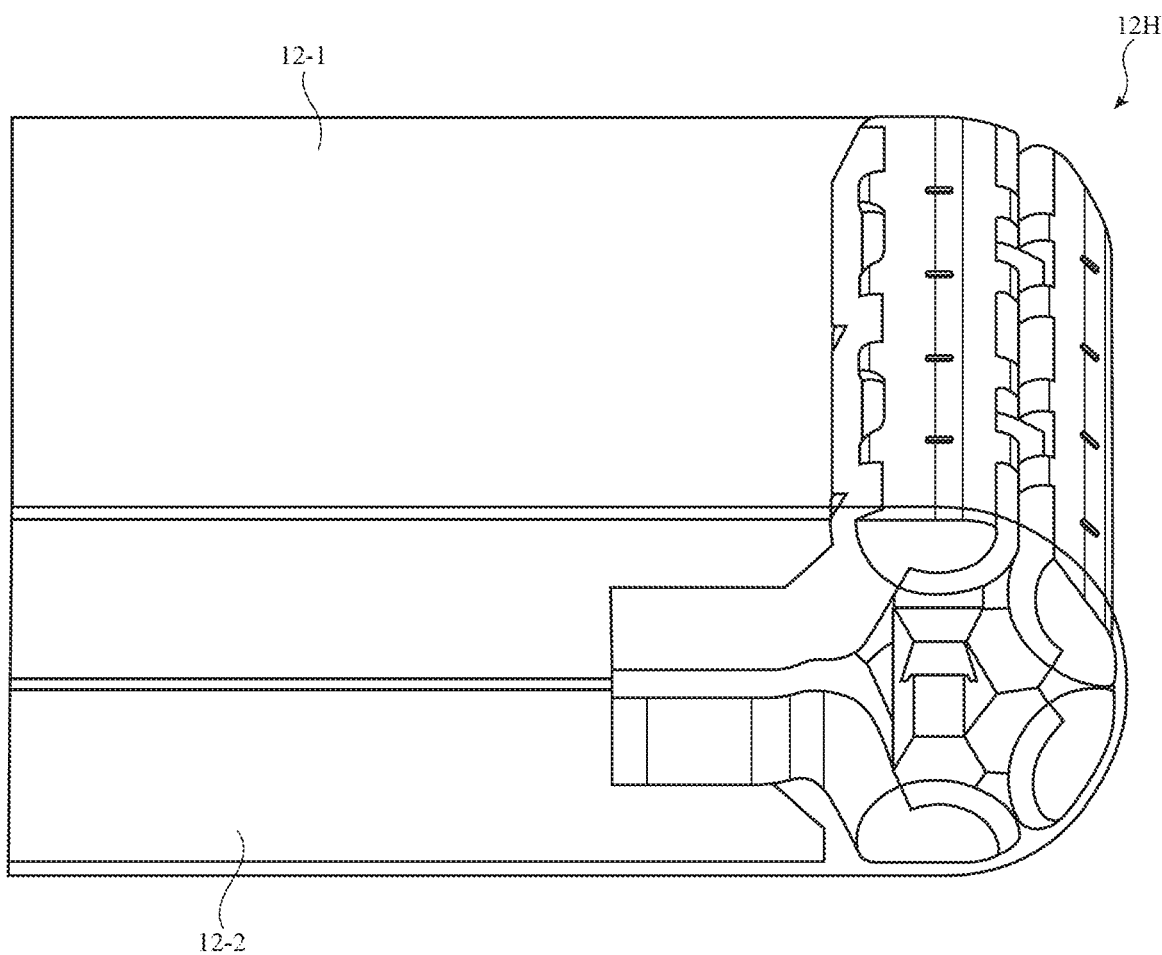
FIG. 23 is a perspective view of the illustrative device of FIG. 21 in a configuration in which the hinge has been bent by 180° in accordance with an embodiment.

FIGS. 21, 22, and 23 are perspective views of hinges structure 12H in unbent, partially bent, and fully bent configurations, respectively. Display 14 is not shown in FIGS. 21, 22, and 23 to permit hinge structures 12H to be viewed. As shown in FIG. 21, bars 122 have elongated shapes that run parallel to bend axis 58. In the example of FIG. 21, hinge structures 12H have four bars 122. Hinge structures with fewer bars 122 or more bars 122 may be used, if desired. As shown in FIG. 21, portions CP of the hinge structures 12H that couple adjacent hinge structures (e.g., linking structures) may be staggered with respect to each other. There may be, for example, two link portions CP that couple the first and second bars in FIG. 21, three offset link portions CP that couple the second and third bars in FIG. 21, etc.

Figure 24:
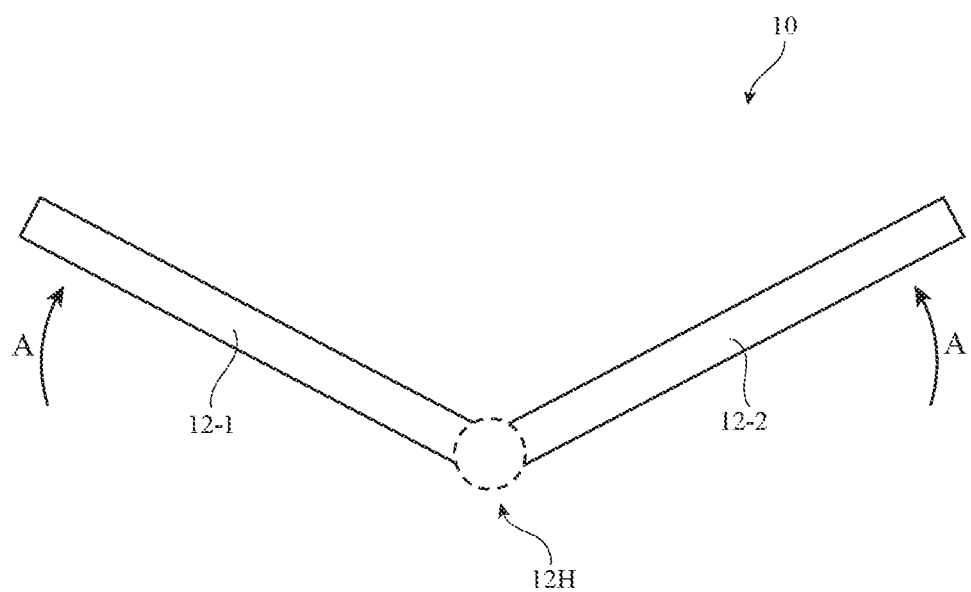
FIG. 24 is a side view of an illustrative foldable electronic device with a folding mechanism that synchronizes movement of first and second hinged housing portions in accordance with an embodiment.

A cross-sectional side view of device 10 showing how housing portions 12-1 and 12-2 may be joined using bendable hinge structures 12H is shown in FIG. 24. To prevent undesired stress on display 14, it may be desirable to synchronize the movement of one half of housing 12 with the other. For example, it may be desirable to configure hinge structure 12H so that movement of first housing portion 12-1 through an angle A will cause second housing portion 12-2 to move through an equal angle A, as shown in FIG. 24.

Figure 25:
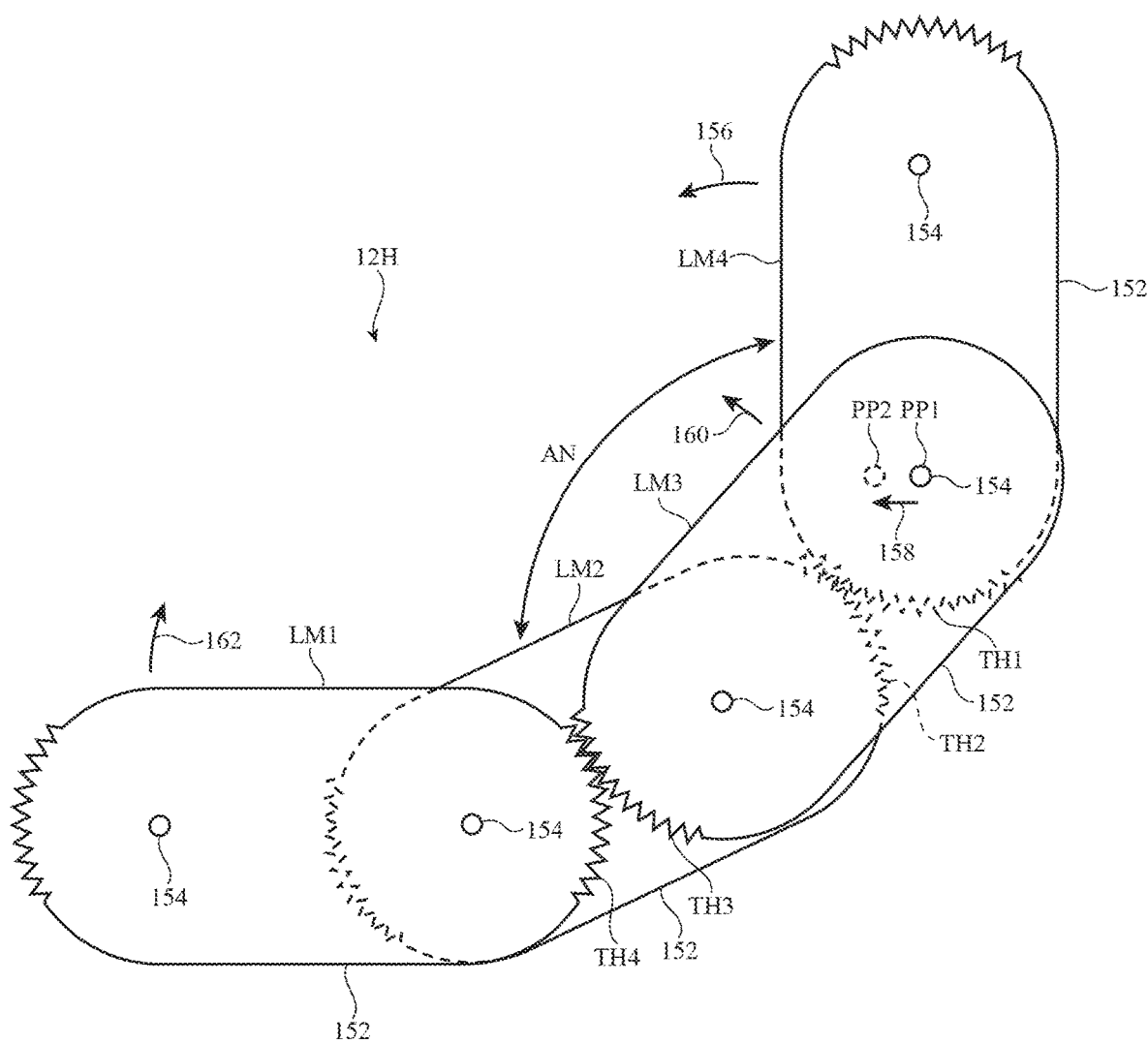
FIG. 25 is a side view of synchronized hinge structures for use in an electronic device such as the electronic device of FIG. 24 in accordance with an embodiment.

One way in which to synchronize movement of housings 12-1 and 12-2 is to provide meshing gears in the components of hinge structures 12H. In the example of FIG. 25, hinge structures 12H include chain link members 152 with gear teeth at opposing ends. Each member 152 has an associated pair of pins 154 that help hold together two other chain link members. With this arrangement, movement of the chain link member on one end of chain hinge structures 12H will cause synchronized movement of a chain link member at an opposing end of chain hinge structures 12H.

Consider, as an example, a scenario in which the location of member LM2 is held fixed and in which tip TP of member LM4 is moved in direction 156. Gear teeth TH1 of member LM4 engage gear teeth TH2 of member LM2, so movement of member LM4 in direction 156 causes angle AN between LM2 and LM4 to decrease. This moves the position of pin PP1 in direction 158 to the position shown by pin PP2. As a result of this movement, member LM3 rotates in direction 160. Teeth TH3 of member LM3 engage teeth TH4 of member LM1, so rotation of member LM3 in direction 160 causes member LM1 to rotate in direction 162. As this example demonstrates, counterclockwise rotation of member LM4 in direction 156 produces a corresponding synchronized clockwise rotation of member LM1. Synchronization of the behavior of links 152 in this way helps constrain the relative motion of each link to the next and ensures that display 14 is bent smoothly and evenly during folding. If desired, geared engagement structures of the type shown in FIG. 25 may be used with hinge links such as links 120 of FIG. 20.

Figure 26:
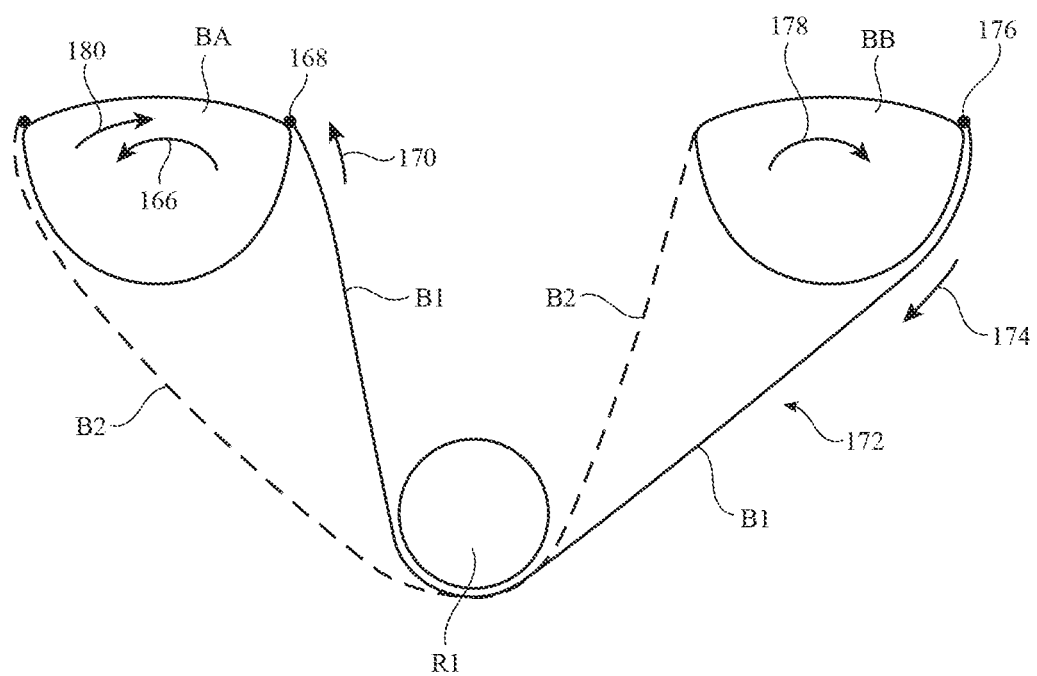
FIG. 26 is a side view of illustrative pulley mechanisms that may be used to help synchronize movement between hinge structures in an electronic device such as the electronic device of FIG. 24 in accordance with an embodiment.

It may also be desirable to synchronize motion of hinge structures such as bars 122 of FIG. 20. With one illustrative arrangement, belt structures such as belts B1 and B2 of FIG. 26 may be used to synchronize rotation of bars such as bars BA and BB. Rollers (pulleys, etc.) such as roller R1 may be used to route belts B1 and B2 to opposing edges of bars BA and BB. With this arrangement, for example, rotation of bar BA in direction 166 will cause edge 168 of bar BA to move upward in direction 170, thereby pulling belt B1 up. Roller R1 causes portion 172 of belt B1 to pull downwards in direction 174 on edge 176 of bar BB, thereby causing bar BB to rotate in direction 178. Belt B2 may similarly be used to synchronize rotation of bars BA and BB when bar BA is rotated in direction 180.

Figure 27:
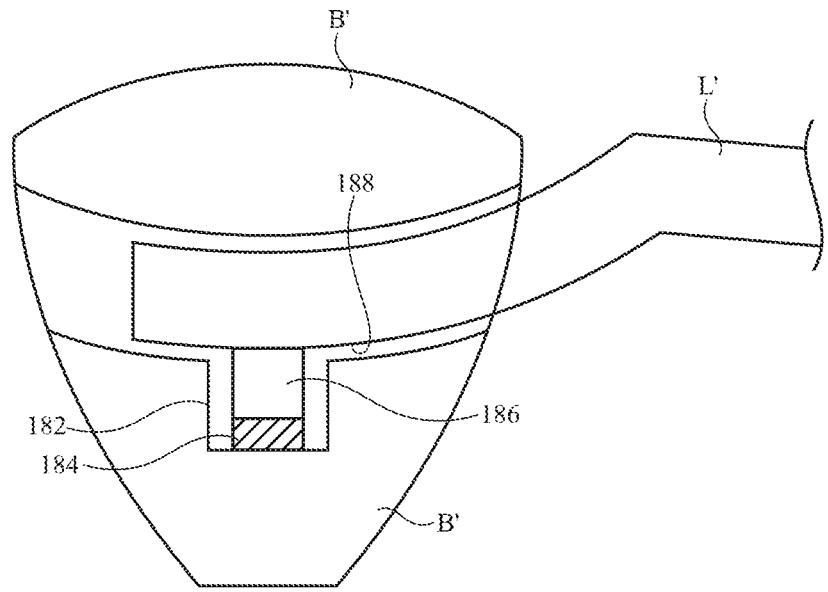
FIG. 27 is a cross-sectional side view of an illustrative friction mechanism for a hinge in accordance with an embodiment.
Figure 28:
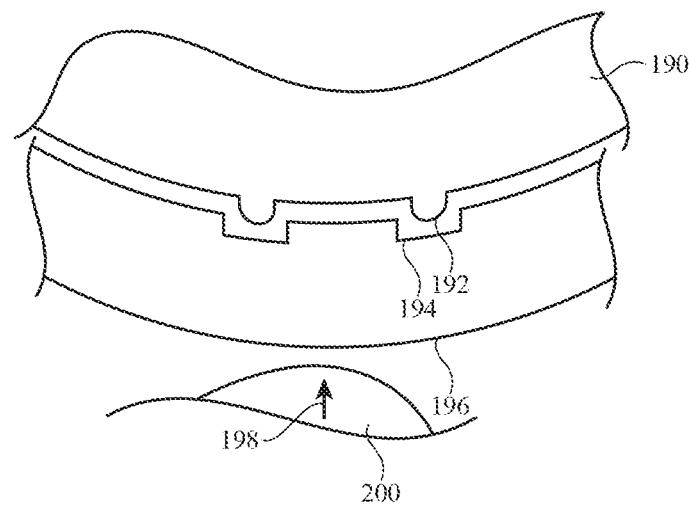
FIG. 28 is a cross-sectional side view of an illustrative detent mechanism for a hinge in accordance with an embodiment.

In some configurations, friction may be produced between portions of hinge structures 12H (e.g., to control the amount of force used to open and close hinge structures 12H). As shown in FIG. 27, for example, bar B' may have a cavity such as cavity 182. Biasing member 184 (e.g., compressible foam, a spring, etc.) may push friction member 186 upwards against lower surface 188 of link L', thereby imparting friction between link L' and bar B' (e.g., member 184) as hinge structures 12H are folded. FIG. 28 shows how detent structures may be formed between moving members (e.g., bars and links) in hinge structures 12H. In the example of FIG. 28, member 190 (e.g., a link) has protrusions 192 that engage with recesses 194 in member 196 (e.g., a bar). When sufficient rotational force is applied, protrusions 192 will disengage from recesses 194 (overcoming biasing pressure 198 from hinge structure 200) and thereby allow member 190 to rotate relative to member 196.

Figure 29:
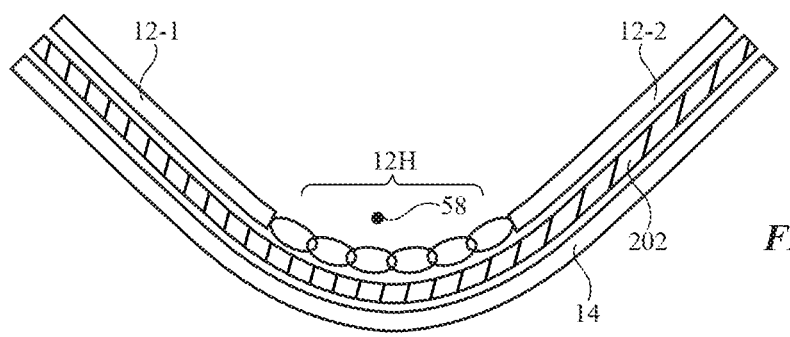
FIG. 29 is a cross-sectional side view of an illustrative foldable device hinge mechanism with a layer of flexible material such as a spring metal sheet or other flexible sheet to help synchronize movement of respective foldable device housing portions while supporting a flexible display in accordance with an embodiment.
Figure 30:
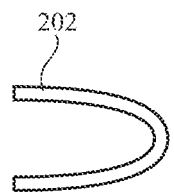
FIGS. 30, 31, and 32 are side views of illustrative profiles of prestressed layers of flexible metal in accordance with an embodiment.
Figure 31:
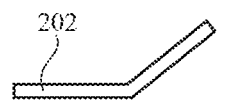
Figure 32:
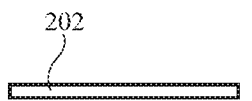

If desired, movement of housing structures 12-1 and 12-2 and the curvature of device 10 in the bending portion of display 14 can be controlled using a sheet of spring metal or other flexible sheet of material. Consider, as an example, device 10 of FIG. 29. As shown in FIG. 29, device 10 may include first housing portion 12-1 and second housing portion 12-2. Hinge structures 12H may be used to couple portions 12-1 and 12-2 for folding motion about bend axis 58 (e.g., so that device 10 can be placed in shapes such as the shapes of FIGS. 30, 31, and 32). Flexible sheet 202 (e.g., a sheet of spring metal or other flexible material such as flexible polymer, flexible sheets for from other materials and/or stacks of laminated sheets of one or more materials, etc.) may overlap hinge structure 12H and, if desired, may overlap some or all of housing portions 12-1 and 12-2. When device 10 is bent about bend axis 58, flexible sheet 202 will bend about axis 58 while resisting sharp kinks or other features that might wrinkle display 14. Sheet 202 may serve as backing layer 70 of display 14 (FIG. 7) or may be serve as an additional supporting layer for display 14.

Figure 33:
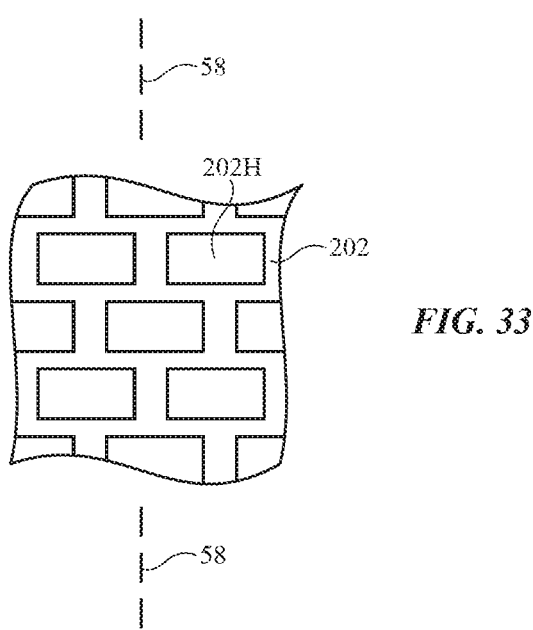
FIG. 33 is top view of an illustrative pattern of flexibility-enhancement openings for the layer of flexible material of FIG. 29 in accordance with an embodiment.

To facilitate folding and unfolding (e.g., to prevent excess stress in a folded or unfolded state), some or all of sheet 202 may be prestressed. For example, sheet 202 or portions of sheet 202 may be prestressed to help overcome the spring force of a flexible display that is trying to open device 10 (e.g., to make closing the device easier). If desired, sheet 202 may be used to help enforce a constant curvature in display 14 as display 14 is bent. The incorporation of sheet 202 may also help synchronize the movement of links in hinge 12H. FIG. 33 shows how openings 202H may be formed at one or more locations in sheet 202 (e.g., locations overlapping bend axis 58). By including openings 202H, the flexibility of sheet 202 may be enhanced.

Figure 34:
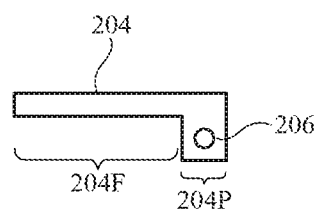
FIG. 34 is a side view of an illustrative movable hinge plate for a foldable device in accordance with an embodiment.

In some configurations, device 10 may have a movable hinge pin support member such as a sliding hinge pin support plate. A side view of an illustrative hinge pin support plate is shown in FIG. 34. As shown in FIG. 34, hinge pin support plate 204 may have a planar portion 204F and a protruding portion 204P. Hinge pin 206 may be supported in a hole in protrusion 204P.

Figure 35:
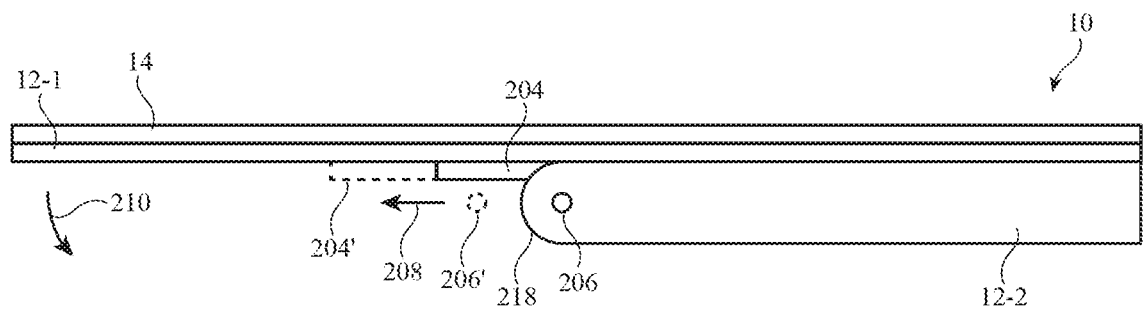
FIG. 35 is a side view of an illustrative foldable electronic device that includes the movable hinge plate of FIG. 34 in accordance with an embodiment.

FIG. 35 is a side view of an illustrative folding device that includes sliding hinge pin support plate 204. As shown in FIG. 35, hinge pin support plate 204 may be coupled to housing portion 12-1 and may slide relative to housing 12 as device 10 is folded and unfolded. In particular, housing portion 12-1 may move in direction 208 when device 10 is folded in direction 210. This causes hinge pin support plate 204 to move in direction 208 to position 204'. As a result, hinge pin 206 moves to position 206'. The dynamic movement of the location of hinge pin 206 during folding helps ensure that the structures of housing portion 12-1 can smoothly wrap around curved surface 212 of portion 12-1, thereby helping to smoothly bend display 14.

Figure 36:
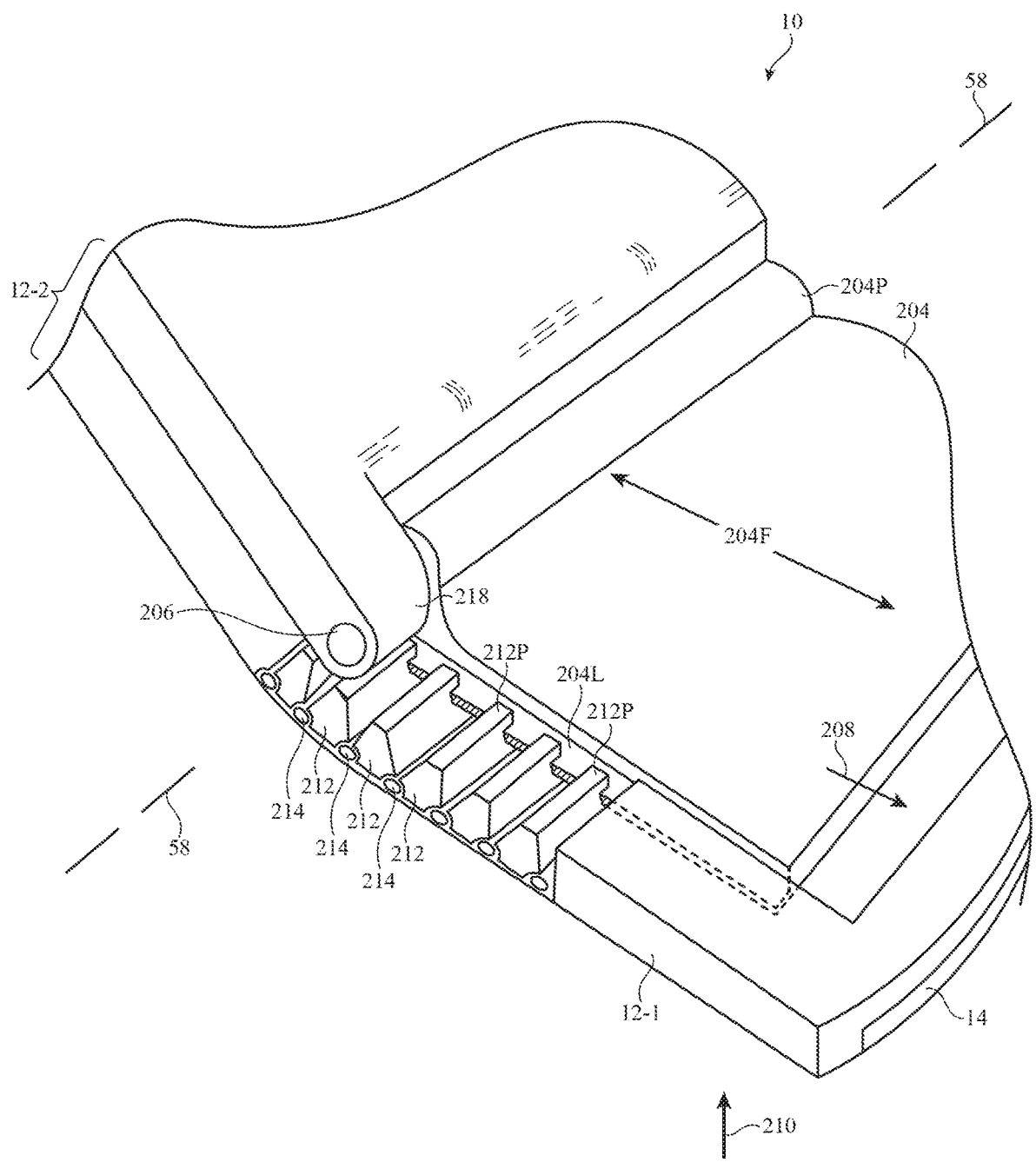
FIG. 36 is a perspective view of a portion of the illustrative foldable electronic device of FIG. 35 showing how the hinge structures of the device may include the movable hinge plate and a set of hinge links in accordance with an embodiment.

A perspective view of illustrative device 10 of FIG. 35 is shown in FIG. 36. In the arrangement of FIG. 36, device 10 is in a partly folded state. As shown in FIG. 36, the outer surfaces of housing portions 12-1 and 12-2 may be covered with flexible display 14 (and, if desired, may include flexible supporting structures such as flexible sheet 202 of FIG. 29).

Figure 37:
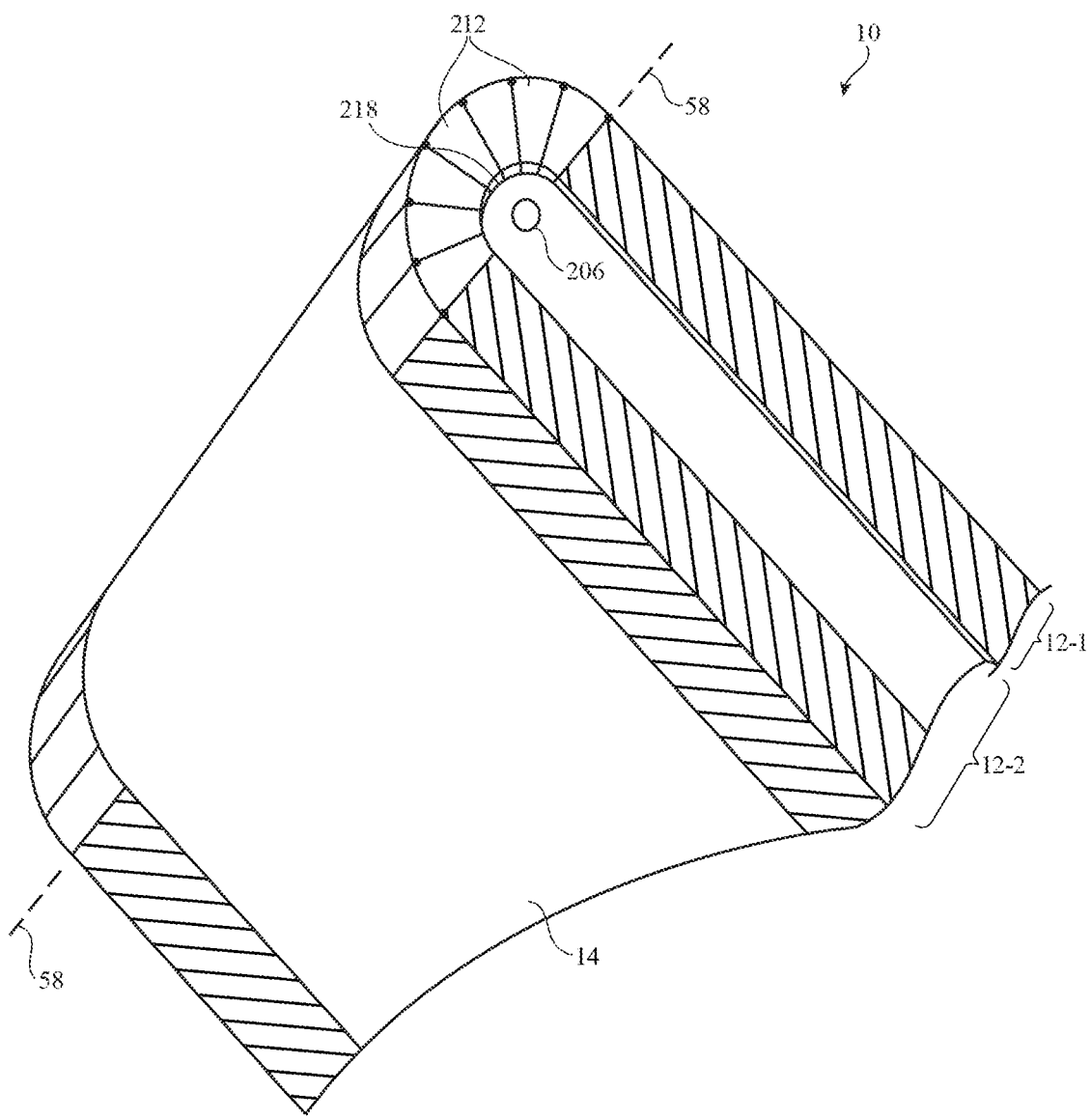
FIG. 37 is a perspective view of the device of FIG. 36 in a folded configuration in accordance with an embodiment.

Housing portion 12-2 is configured to receive the opposing ends of hinge pin 206, so that housing portion 12-1 rotates relative to housing portion 12-2 about hinge axis 58. During folding of device 10, portion 12-1 moves in direction 210, which causes hinge pin support plate 204 to move in direction 208 within a track formed by parts of portion 12-1 that overlap a protruding lip portion of plate 208 such as lip 204L. Links 212 are joined to adjacent links 212 in the hinge structures of device 10 using link joints 214, so that links 212 form bendable hinge structures. Links 212 have protruding portions such as protrusions 212P that overlap lip 204L, thereby preventing plate 204 and links 212 from separating. The surfaces of links 212 that face display 14 may be attached to display 14 (and/or may be attached to associated supporting structures such as flexible sheet 202). FIG. 37 shows how links 212 are smoothly wrapped around surface 218 of housing portion 12-2, which surrounds (is at least partly wrapped around) hinge pin 206, during folding of housing portions 12-1 and 12-2 together due to the sliding movement of plate 204 and hinge pin 206. The configuration of FIG. 36 may be used to align bend axis 58 with display 14, thereby helping to place a reduced stress plane (e.g., a neutral stress plane or an approximately neutral stress plane) within display 14 (e.g., within a stress-sensitive portion of display 14 such as a layer of thin-film pixel structures, an encapsulation layer formed from brittle dielectric materials, a glass layer or other stress-sensitive layer serving as a display cover layer, etc.).

Device 10 may be operated in a system that uses personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is illustrative and various modifications can be made to the described embodiments. The foregoing embodiments may be implemented individually or in any combination.

What is claimed is:

1. A foldable electronic device, comprising:
   a housing having a first housing portion and a second housing portion coupled with hinge structures, wherein the hinge structures include links and bars configured to rotate relative to each other about respective pivot points; and
   a flexible display that overlaps the first housing portion, the hinge structures, and the second housing portion, wherein the pivot points define a reduced stress plane that lies within the flexible display, the reduced stress plane is a neutral stress plane, the housing and the flexible display are movable between an unfolded state and a folded state, the links and the bars are configured to contact the flexible display in the unfolded state, and the bars are configured to contact the flexible display without the links in the folded state.

2. The foldable electronic device defined in claim 1 wherein the flexible display comprises an organic light-emitting diode display having a layer of pixels.

3. The foldable electronic device defined in claim 2 further comprising a flexible sheet of metal between the flexible display and the hinge structures.

4. The foldable electronic device defined in claim 1 wherein the links and bars comprise stop surfaces.

5. The foldable electronic device defined in claim 1 wherein the links and the bars comprise opposing curved bearing surfaces.

6. The foldable electronic device defined in claim 1 wherein the links have convex surfaces that face the flexible display.

7. A foldable electronic device, comprising:
   a housing having a first housing portion and having a second housing portion coupled at hinge structures, wherein the hinge structures include a plurality of links and a plurality of bars, wherein the links and bars have opposing curved bearing surfaces, the curved bearing surfaces of the bars have a first curvature, the bars have convex outer surfaces opposite the curved bearing surfaces of the bars, wherein the convex outer surfaces have a second curvature that is different from the first curvature, and each link is configured to rotate about a pivot point relative to an associated one of the bars; and
   a flexible display that overlaps the first housing portion, the convex outer surfaces of the bars in the hinge structures, and the second housing portion, wherein the pivot points define a reduced stress plane that lies within the flexible display, the reduced stress plane is a neutral stress plane, the housing and the flexible display are movable between an unfolded state and a folded state, the links and the bars are configured to contact the flexible display in the unfolded state, and the bars are configured to contact the flexible display without the links in the folded state.

8. The foldable electronic device defined in claim 7 wherein the flexible display comprises an array of organic light-emitting diode pixels and wherein the reduced stress plane lies within the flexible display.

9. The foldable electronic device defined in claim 7 wherein each of the bars has a stop surface and wherein each of the links has an opposing stop surface.

10. The foldable electronic device defined in claim 7 wherein, when the first and second housing portions are folded together, the flexible display is folded outwardly and a bent portion of the flexible display is supported on an outwardly facing surface of the hinge structures.

11. The foldable electronic device defined in claim 7 wherein each bar has a first portion and a second portion joined by a post and wherein each link has an opening through which the post protrudes.

12. The foldable electronic device defined in claim 11 wherein the posts have stop surfaces that are configured to contact corresponding side surfaces of the openings and thereby stop bending of the hinge structures as the first and second housing portions are folded together.

13. A foldable electronic device, comprising:
   a housing having a first housing portion and a second housing portion coupled with hinge structures, wherein the hinge structures include links and bars configured to rotate relative to each other about respective pivot points; and
   a flexible display that overlaps the first housing portion, the hinge structures, and the second housing portion, the housing and the flexible display are movable between an unfolded state and a folded state, the links and the bars are configured to contact the flexible display in the unfolded state, and the bars are configured to contact the flexible display without the links in the folded state.

14. The foldable electronic device defined in claim 13 wherein the bars comprise convex surfaces that support the flexible display in the unfolded state.

15. The foldable electronic device defined in claim 14 wherein the links comprise additional convex surfaces.

16. The foldable electronic device defined in claim 14 wherein the links and the bars comprise opposing curved bearing surfaces.

17. The foldable electronic device defined in claim 16 wherein the links and the bars are configured to rotate with respect to each other about the respective pivot points along the opposing curved bearing surfaces.

18. The foldable electronic device defined in claim 13, wherein the flexible display has a neutral stress plane, and the respective pivot points are within the neutral stress plane.

* * * * *